US012813361B2

(12) United States Patent
Tsao et al.

(10) Patent No.: US 12,813,361 B2
(45) Date of Patent: Nov. 24, 2026

(54) FAN-OUT PACKAGES AND METHODS OF FORMING THE SAME

(71) Applicant: Taiwan Semiconductor Manufacturing Co., Ltd., Hsinchu (TW)

(72) Inventors: Chih-Chiang Tsao, Taoyuan (TW); Chao-Wei Chiu, Hsinchu (TW); Hsuan-Ting Kuo, Taichung (TW); Chia-Lun Chang, Tainan (TW); Cheng-Shiuan Wong, Hsinchu (TW); Hsiu-Jen Lin, Zhubei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 99 days.

(21) Appl. No.: 17/870,423

(22) Filed: Jul. 21, 2022

(65) Prior Publication Data

US 2022/0359356 A1 Nov. 10, 2022

Related U.S. Application Data

(62) Division of application No. 16/727,159, filed on Dec. 26, 2019, now Pat. No. 11,664,300.

(51) Int. Cl.

| | |
|---|---|
| ***H10W 90/00*** | (2026.01) |
| ***H10W 70/05*** | (2026.01) |
| ***H10W 70/685*** | (2026.01) |
| ***H10W 99/00*** | (2026.01) |

(52) U.S. Cl.
CPC ....... *H10W 90/701* (2026.01); *H10W 70/093* (2026.01); *H10W 70/685* (2026.01); *H10W 90/724* (2026.01); *H10W 99/00* (2026.01)

(58) Field of Classification Search
CPC ........... H01L 23/49816; H01L 21/4853; H01L 24/16; H01L 2224/16227; H01L 24/13
See application file for complete search history.

(56) References Cited

U.S. PATENT DOCUMENTS

| | | | |
|---|---|---|---|
| 5,431,325 | A | 7/1995 | Chang et al. |
| 7,851,906 | B2 | 12/2010 | Alcoe et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |

(Continued)

FOREIGN PATENT DOCUMENTS

| | | | |
|---|---|---|---|
| CN | 101276794 | A | 10/2008 |
| CN | 104701289 | A | 6/2015 |

(Continued)

*Primary Examiner* — Brian Turner
(74) *Attorney, Agent, or Firm* — Slater Matsil, LLP

(57) ABSTRACT

A device may include a first package and a second package where the first package has a warped shape. First connectors attached to a redistribution structure of the first package include a spacer embedded therein. Second connectors attached to the redistribution structure are fee from the spacer, the spacer of the first connectors keeping a minimum distance between the first package and the second package during attaching the first package to the second package.

20 Claims, 41 Drawing Sheets

(56) References Cited

U.S. PATENT DOCUMENTS

| | | | |
|---|---|---|---|
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,103,125 | B2 | 10/2018 | Yu et al. |
| 2002/0100610 | A1* | 8/2002 | Yasuda .................. H01L 24/10 257/781 |
| 2003/0119299 | A1* | 6/2003 | Jiang ....................... H01L 24/16 257/E21.511 |
| 2003/0132519 | A1* | 7/2003 | Huang ................. H05K 3/3436 257/772 |
| 2003/0146505 | A1* | 8/2003 | Martin ............. H01L 23/49816 257/737 |
| 2004/0100164 | A1 | 5/2004 | Murata et al. |
| 2004/0159925 | A1 | 8/2004 | Matsuura et al. |
| 2005/0013557 | A1 | 1/2005 | Lu |
| 2007/0096295 | A1 | 5/2007 | Burtzlaff et al. |
| 2008/0174978 | A1 | 7/2008 | Inoue et al. |
| 2009/0008765 | A1 | 1/2009 | Yamano et al. |
| 2009/0045523 | A1 | 2/2009 | Fan et al. |
| 2009/0091022 | A1 | 4/2009 | Meyer et al. |
| 2010/0084765 | A1 | 4/2010 | Lee et al. |
| 2011/0114840 | A1 | 5/2011 | Yamazaki et al. |
| 2011/0128713 | A1 | 6/2011 | Kawano et al. |
| 2011/0163441 | A1* | 7/2011 | Bachman ................ H01L 24/11 257/737 |
| 2011/0304029 | A1 | 12/2011 | Sogawa et al. |
| 2011/0318878 | A1 | 12/2011 | Tanaka |
| 2012/0193783 | A1* | 8/2012 | Hong ................ H01L 23/49811 257/737 |
| 2012/0273960 | A1 | 11/2012 | Park et al. |
| 2013/0264708 | A1 | 10/2013 | Hiwatashi |
| 2013/0293355 | A1 | 11/2013 | Christopher |
| 2014/0091463 | A1 | 4/2014 | Yu et al. |
| 2014/0264792 | A1 | 9/2014 | Yang et al. |
| 2014/0319661 | A1* | 10/2014 | Pagaila ............... H01L 23/3121 438/618 |
| 2014/0319682 | A1 | 10/2014 | Sidhu et al. |
| 2015/0041987 | A1 | 2/2015 | Yew et al. |
| 2015/0162258 | A1 | 6/2015 | Hsu et al. |
| 2015/0162265 | A1 | 6/2015 | Jo et al. |
| 2015/0259194 | A1 | 9/2015 | Lin et al. |
| 2016/0329289 | A1* | 11/2016 | Brunschwiler ...... B23K 1/0053 |
| 2017/0077022 | A1 | 3/2017 | Scanlan et al. |
| 2017/0136582 | A1* | 5/2017 | Cheng ............... H01L 23/49894 |
| 2017/0365583 | A1 | 12/2017 | Im et al. |
| 2018/0116050 | A1* | 4/2018 | Wenzel ............ H01L 23/49894 |
| 2019/0029125 | A1 | 1/2019 | Matsuura |
| 2019/0103353 | A1 | 4/2019 | Liu et al. |
| 2019/0157192 | A1 | 5/2019 | Grassmann et al. |
| 2019/0326245 | A1 | 10/2019 | Baello et al. |
| 2019/0333851 | A1* | 10/2019 | Agarwal ............... H01L 21/565 |
| 2020/0091109 | A1 | 3/2020 | Lo et al. |
| 2020/0357752 | A1 | 11/2020 | Yazzie et al. |

FOREIGN PATENT DOCUMENTS

| | | | |
|---|---|---|---|
| CN | 104716103 | A | 6/2015 |
| CN | 108699673 | A | 10/2018 |
| CN | 109585391 | A | 4/2019 |
| KR | 20120001621 | A | 1/2012 |
| KR | 20150017681 | A | 2/2015 |
| TW | 201306197 | A | 2/2013 |
| TW | I1503947 | B | 10/2015 |
| TW | 201830649 | A | 8/2018 |
| TW | 201935580 | A | 9/2019 |
| WO | 2006119533 | A1 | 11/2006 |

* cited by examiner

FAN-OUT PACKAGES AND METHODS OF FORMING THE SAME

PRIORITY CLAIM AND CROSS-REFERENCE

This patent is a divisional of U.S. application Ser. No. 16/727,159, filed on Dec. 26, 2019, which applications is hereby incorporated by reference herein as if reproduced in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 28A and 28B illustrate various intermediate steps in a process of forming an integrated fan-out package, in accordance with some embodiments.

DETAILED DESCRIPTION

Figure 1:
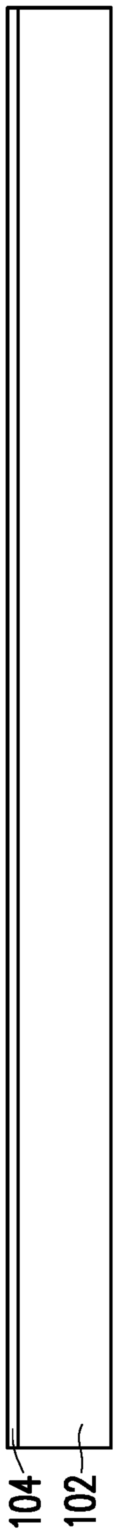

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments include an integrated fan-out (InFO) package including a die and integrated redistribution structure. Due to a mismatch in the coefficient of thermal expansion (CTE) of the various materials in the InFO package, warpage can cause bowing in the InFO package. Bowing can include both positive biased bowing (a "smile" shape) and negative biased bowing (a "cry" or "frown" shape). Due to the warpage, when the InFO package is attached to another device, such as a printed circuit board (PCB), some areas of the InFO package are closer to the PCB than other areas. For example, if the warpage results in a frown shape InFO package, when the InFO package is aligned to the PCB to attach to the PCB, the distance between the edges of the InFO package and the PCB is less than the distance between the middle of the InFO package and the PCB. When solder connectors are reflowed to attach the InFO package to the PCB, the warped edges may press too close to the PCB. As a result, solder bridging between connectors could occur where the smaller space between the InFO package and PCB squeezes the solder too near to an adjacent connector. A similar situation arises for a smile shape warpage, except that the center of the InFO package may be too close to the PCB, causing bridging between connectors at the center. Embodiments address this issue by utilizing a spacer between the InFO package and the PCB which is integrated into the connector to maintain a minimum distance between the InFO package and the PCB.

FIGS. 1 through 28A and 28B illustrate cross-sectional views of intermediate steps of a process for forming an integrated fan-out package 100, in accordance with some embodiments. The formation of the integrated fan-out package 100 may be used in any of the embodiments relating to the connector spacers discussed below. FIGS. 1 through 12 illustrate cross-sectional views of intermediate steps of a process for forming the integrated fan-out package 100 until the package 100 is ready to receive connectors.

In FIG. 1, a carrier substrate 102 is provided for the package 100, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled.

Figure 2:
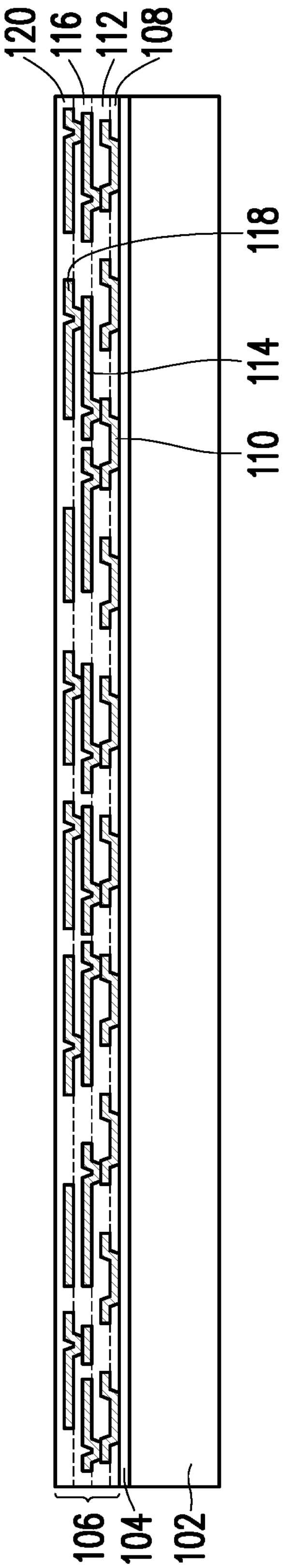

In FIG. 2, a first redistribution structure 106 is formed on the release layer 104. The first redistribution structure 106 includes dielectric layers 108, 112, 116, and 120; and metallization patterns 110, 114, and 118. The metallization patterns may also be referred to as redistribution layers or redistribution lines. The first redistribution structure 106 is shown as an example. More or fewer dielectric layers and metallization patterns may be formed in the first redistribution structure 106. If fewer dielectric layers and metallization patterns are to be formed, steps and process discussed below may be omitted. If more dielectric layers and metallization patterns are to be formed, steps and processes discussed below may be repeated.

As an example to form the first redistribution structure 106, the dielectric layer 108 is deposited on the release layer 104. In some embodiments, the dielectric layer 108 is formed of a photo-sensitive material such as polybenzoxazole (PBO), polyimide, benzocyclobutene (BCB), or the like, which may be patterned using a lithography mask. The dielectric layer 108 may be formed by spin coating, lamination, CVD, the like, or a combination thereof. The dielectric layer 108 is then patterned. The patterning forms openings exposing portions of the release layer 104. The patterning may be by an acceptable process, such as by exposing the dielectric layer 108 to light when the dielectric layer 108 is a photo-sensitive material or by etching using, for example, an anisotropic etch. If the dielectric layer 108 is a photo-sensitive material, the dielectric layer 108 can be developed after the exposure.

The metallization pattern 110 is then formed. The metallization pattern 110 includes conductive lines on and extending along the major surface of the dielectric layer 108. The metallization pattern 110 further includes conductive vias extending through the dielectric layer 108. To form the metallization pattern 110, a seed layer is formed over the dielectric layer 108 and in the openings extending through the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A photo resist is then formed and patterned on the seed layer. The photo resist may be formed by spin coating or the like and may be exposed to light for patterning. The pattern of the photo resist corresponds to the metallization pattern 110. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 110. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

The dielectric layer 112 is deposited on the metallization pattern 110 and dielectric layer 108. The dielectric layer 112 may be formed in a manner similar to the dielectric layer 108, and may be formed of the same material as the dielectric layer 108.

The metallization pattern 114 is then formed. The metallization pattern 114 includes conductive lines on and extending along the major surface of the dielectric layer 112. The metallization pattern 114 further includes conductive vias extending through the dielectric layer 112 to be physically and electrically connected to the metallization pattern 110. The metallization pattern 114 may be formed in a manner similar to the metallization pattern 110, and may be formed of the same material as the metallization pattern 110. The conductive vias of the metallization pattern 114 have smaller width than the conductive vias of the metallization pattern 110. As such, when patterning the dielectric layer 112 for the metallization pattern 114, the width of the openings in the dielectric layer 112 are smaller than the width of the openings in the dielectric layer 108.

The dielectric layer 116 is deposited on the metallization pattern 114 and dielectric layer 112. The dielectric layer 116 may be formed in a manner similar to the dielectric layer 108, and may be formed of the same material as the dielectric layer 108.

The metallization pattern 118 is then formed. The metallization pattern 118 includes conductive lines on and extending along the major surface of the dielectric layer 116. The metallization pattern 118 further includes conductive vias extending through the dielectric layer 116 to be physically and electrically connected to the metallization pattern 114. The metallization pattern 118 may be formed in a manner similar to the metallization pattern 110, and may be formed of the same material as the metallization pattern 110. The conductive vias of the metallization pattern 118 have smaller width than the conductive vias of the metallization pattern 110. As such, when patterning the dielectric layer 116 for the metallization pattern 114, the width of the openings in the dielectric layer 116 are smaller than the width of the openings in the dielectric layer 108.

The dielectric layer 120 is deposited on the metallization pattern 118 and dielectric layer 116. The dielectric layer 120 may be formed in a manner similar to the dielectric layer 108, and may be formed of the same material as the dielectric layer 108.

Figure 3:
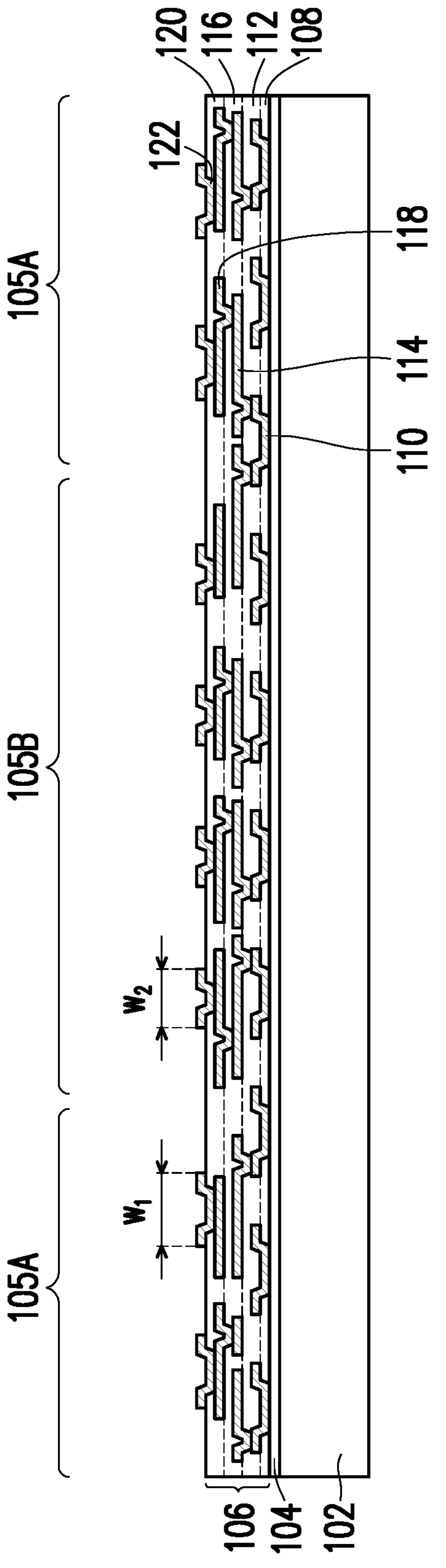

In FIG. 3, the UBMs 122 are formed on and extend through the dielectric layer 120. As an example to form the UBMs 122, the dielectric layer 120 may be patterned to form openings exposing portions of the metallization pattern 118. The patterning may be by an acceptable process, such as by exposing the dielectric layer 120 to light when the dielectric layer 120 is a photo-sensitive material or by etching using, for example, an anisotropic etch. If the dielectric layer 120 is a photo-sensitive material, the dielectric layer 120 can be developed after the exposure. In some embodiments, the openings for the UBMs 122 may be wider than the openings for the conductive via portions of the metallization patterns 110, 114, and 118. In some embodiments, the openings of the UBMs 122 may be narrower than or about the same width as the openings for the conductive via portions of the metallization patterns 110, 114, and 118. A seed layer is formed over the dielectric layer 120 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 122. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 122. In embodiments where the UBMs 122 are formed differently, more photoresist and patterning steps may be utilized.

The UBMs 122 may not all have the same width. In some embodiments, a first subset of the UBMs 122 in a first region 105A of the first redistribution structure 106 have a first width $W_1$, and a second subset of the UBMs 122 in a second region 105B of the first redistribution structure 106 have a second width $W_2$. The first width $W_1$ may be different from the second width $W_2$, and in some embodiments the first width $W_1$ is greater than the second width $W_2$. Width $W_1$ may be between about 100 μm and about 300 μm, such as about 170 μm, though other values are contemplated and may be used. Width $W_2$ may be between about 25 μm and about 90 μm, such as about 48 μm, though other values are contemplated and may be used.

Figure 4:
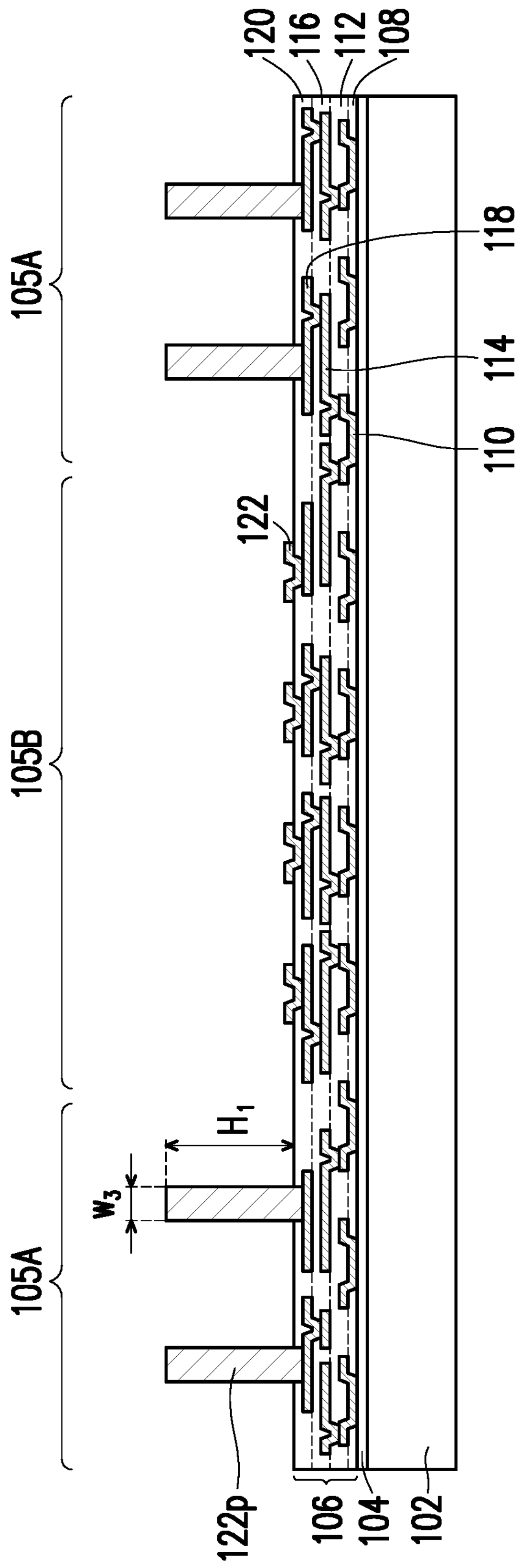

In FIG. 4, some or all of the UBMs 122 of the first region 105A may instead be formed into conductive pillars 122*p*, in accordance with some embodiments. Conductive pillars 122*p* may be formed by continuing plating the UBMs 122 of the first region 105A through the photoresist until conductive pillars 122*p* reach a desired height $H_1$, such as between about 10 μm and about 250 μm, such as about 150 μm, though other values are contemplated and may be used. In some embodiments, the width $W_3$ of the conductive pillars may correspond to the openings in the dielectric layer 120 which was patterned to expose portions of the metallization pattern 118. In some embodiments, the width $W_3$ may be wider or narrower than the openings in the dielectric layer 120. Width $W_3$ may be between about 50 μm and about 300 μm, such as about 150 μm, though other values are contemplated and may be used.

Figure 5:
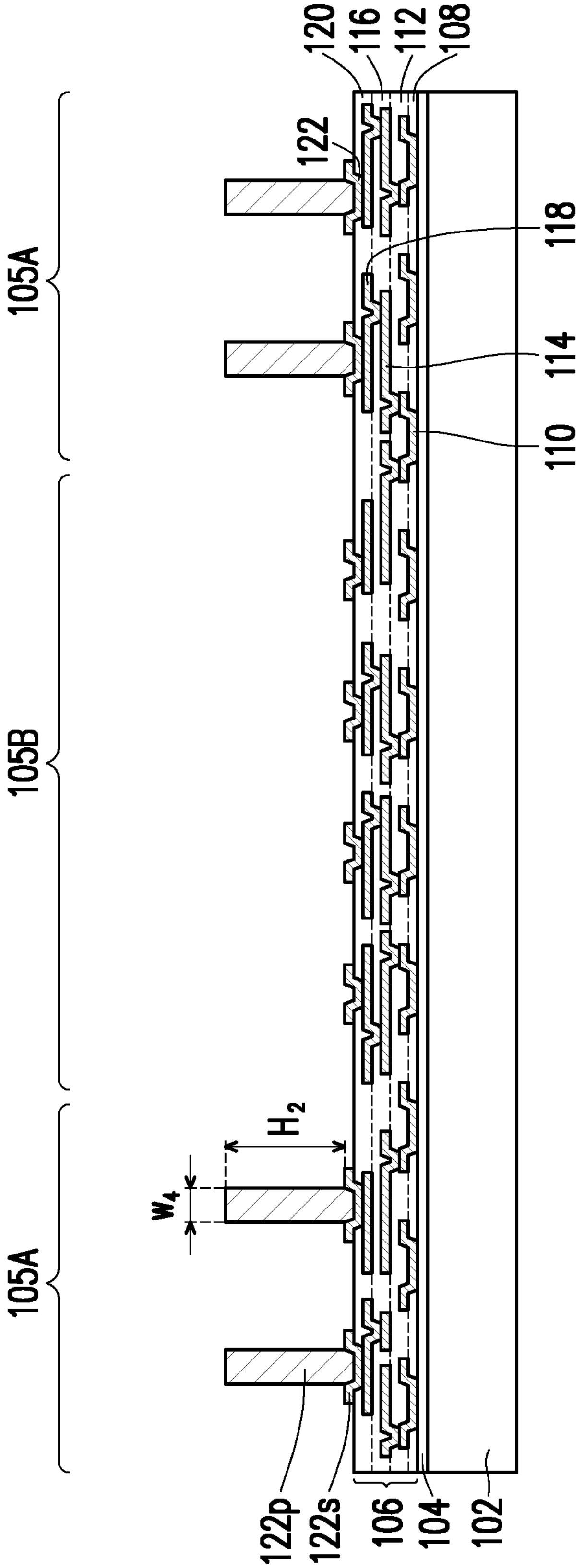

In FIG. 5, some or all of the UBMs 122 of the first region 105A may have conductive pillars 122*p* disposed thereon, in accordance with some embodiments. After forming the UBMs 122, another photoresist may be formed by spin coating or the like and exposed to light for patterning. The pattern of the photoresist corresponds to the pattern for the conductive pillars 122*p*. The patterning forms openings in the photoresist to expose the UBMs 122. The conductive material of conductive pillars 122*p* may be formed by plating, such as electroplating or electroless plating, or the like, until conductive pillars 122*p* reach a desired height $H_2$, such as between about 10 μm and about 250 μm, such as about 150 μm, though other values are contemplated and may be used. The width $W_4$ of the conductive pillars corresponds to the width of the openings of the pattern of the photoresist. Width $W_4$ may be between about 50 μm and about 300 μm, such as about 150 μm, though other values are contemplated and may be used. The conductive material may comprise a metal, like copper, titanium, tungsten, aluminum, or the like. Then, the photoresist is removed. The photoresist may be removed by an acceptable ashing or stripping process, such as using an oxygen plasma or the like. The resulting structure may have a shoulder 122*s* of the UBMs 122 surrounding the base of the conductive pillars 122*p*.

Although the remaining Figures illustrate the conductive pillars 122*p* which are configured as described with respect to FIG. 5, it should be understood that the conductive pillars 122*p* which are configured as described with respect to FIG. 4 (i.e., without UBM 122) may be substituted as appropriate unless otherwise noted.

Figure 6:
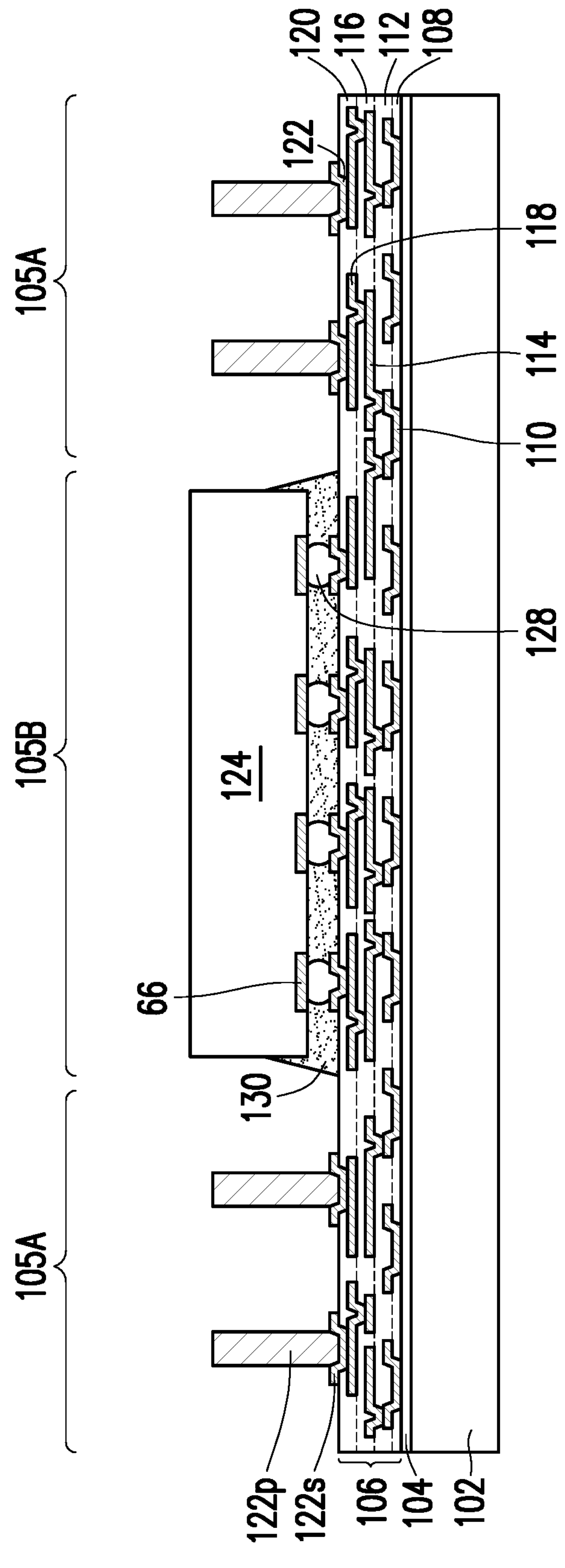

In FIG. 6, an integrated circuit die 124 is placed over the first redistribution structure 106. The integrated circuit die 124 may be aligned and placed using, e.g., a pick-and-place tool. The integrated circuit die 124 is placed on the first redistribution structure 106 such that the conductive connectors 128 are aligned with the UBMs 122 in the second region 105B. After the integrated circuit die 124 is placed, the conductive connectors 128 are reflowed to form joints between corresponding ones of the UBMs 122 and die connectors 66, physically and electrically connecting the integrated circuit die 124 to the first redistribution structure 106.

Figure 7:
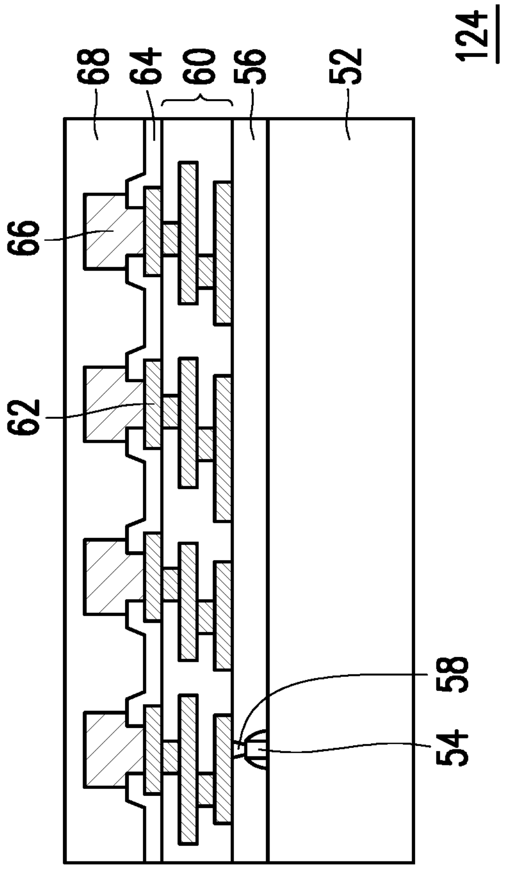

Referring for a moment to FIG. 7, FIG. 7 illustrates a cross-sectional view of an integrated circuit die 124 in accordance with some embodiments. The integrated circuit die 124 will be packaged in subsequent processing to form an integrated circuit package. The integrated circuit die 124 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 124 may be formed in a wafer, which may include different device regions that are singulated in subsequent steps to form a plurality of integrated circuit dies. The integrated circuit die 124 may be processed according to applicable manufacturing processes to form integrated circuits. For example, the integrated circuit die 124 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 7), sometimes called a front side, and an inactive surface (e.g., the surface facing downwards in FIG. 7), sometimes called a back side.

Devices 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 124 further includes pads 62, such as aluminum pads, to which external connections are made. The pads 62 are on the active side of the integrated circuit die 124, such as in and/or on the interconnect structure 60. One or more passivation films 64 are on the integrated circuit die 124, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 124.

Optionally, solder regions (e.g., solder balls or solder bumps) may be disposed on the pads 62. The solder balls may be used to perform chip probe (CP) testing on the integrated circuit die 124. CP testing may be performed on the integrated circuit die 124 to ascertain whether the integrated circuit die 124 is a known good die (KGD). Thus, only integrated circuit dies 124, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 124, such as on the passivation films 64 and the die connectors 66. The dielectric layer 68 laterally encapsulates the die connectors 66, and the dielectric layer 68 is laterally coterminous with the integrated circuit die 124. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 124. In some embodiments, the die connectors 66 remain buried and are exposed during a subsequent process for packaging the integrated circuit die 124. Exposing the die connectors 66 may remove any solder regions that may be present on the die connectors 66.

In some embodiments, the integrated circuit die 124 is a stacked device that include multiple semiconductor substrates 52. For example, the integrated circuit die 124 may be a memory device such as a hybrid memory cube (HMC) module, a high bandwidth memory (HBM) module, or the like that includes multiple memory dies. In such embodiments, the integrated circuit die 124 includes multiple semiconductor substrates 52 interconnected by through-substrate vias (TSVs). Each of the semiconductor substrates 52 may (or may not) have an interconnect structure 60.

Referring back now to FIG. 6, because the active side of the integrated circuit die 124 faces toward the first redistribution structure 106, in accordance with some embodiments, the first redistribution structure 106 may also be referred to as a front-side redistribution structure. And because the active side of the integrated circuit die 124 faces downward toward the first redistribution structure 106, the resulting package may be referred to as a bottom fan-out package. In other embodiments, such as illustrated below with respect to FIGS. 13, 15, 17, 19, 22, 23, 25, and 27, the active side of the integrated circuit die 124 may be facing upward. Conductive connectors 128 may be formed on the die connectors 66 (see FIG. 7). The conductive connectors 128 may be formed from a conductive material such as solder, copper, aluminum, gold, nickel, silver, palladium, tin, the like, or a combination thereof. In some embodiments, the conductive connectors 128 are solder connectors.

An underfill 130 may be formed between the integrated circuit die 124 and first redistribution structure 106, surrounding the conductive connectors 128. As such, the conductive connectors 128 may be protected from mechanical forces. The underfill 130 may be formed by a capillary flow process after the integrated circuit die 124 is attached, or may be formed by a suitable deposition method before the integrated circuit die 124 is attached.

Figure 8:
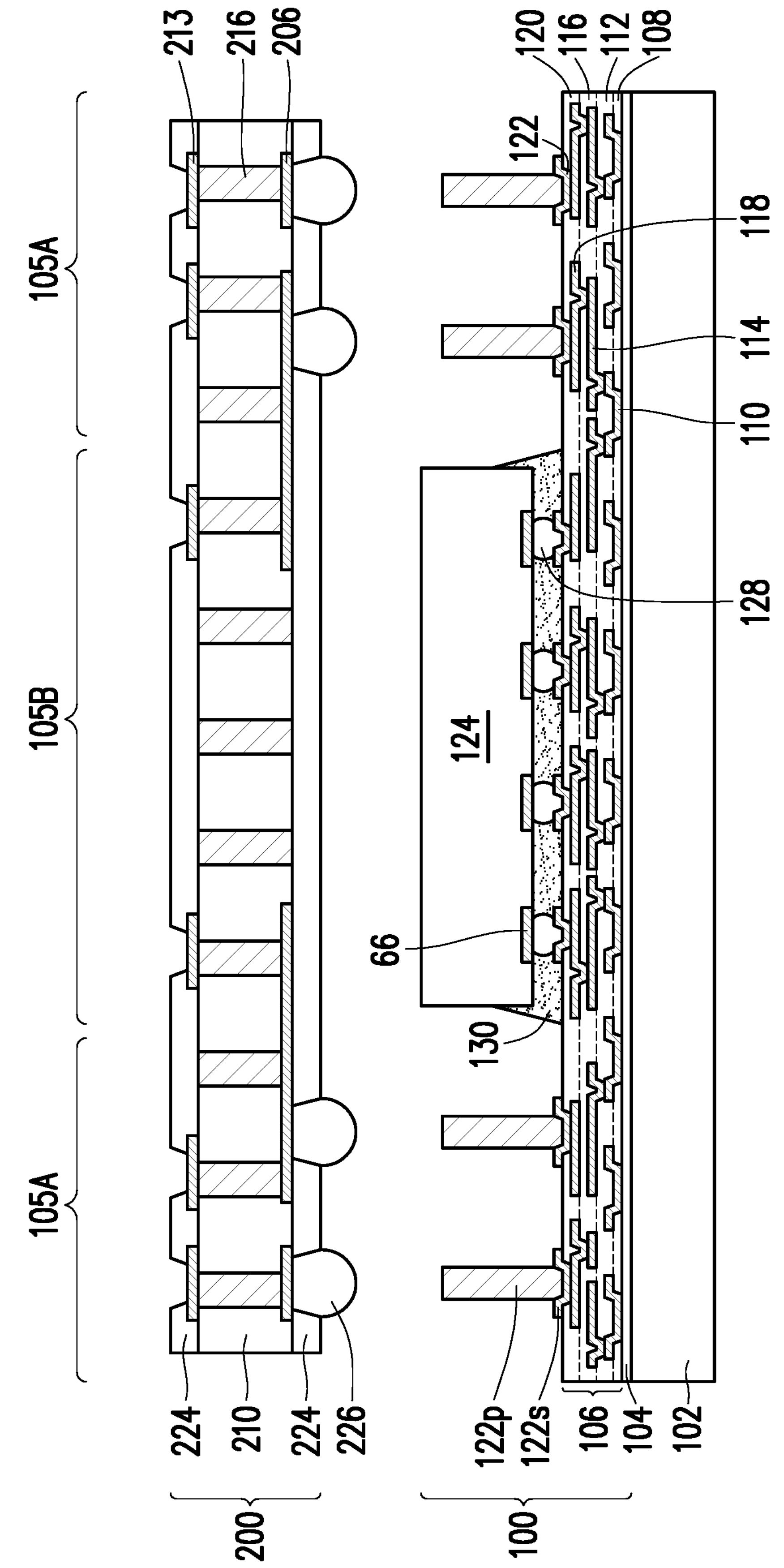

In FIG. 8, a ring or lid 200 is aligned to the conductive pillars 122*p* to couple the conductive connectors 226 to respective ones of the conductive pillars 122*p*, in accordance with some embodiments. The lid 200 may be aligned and placed using, e.g., a pick-and-place tool. The lid 200 is placed on the first redistribution structure 106 such that the conductive connectors 226 are aligned with the UBMs 122 and/or conductive pillars 122*p* in the first region 105A.

The lid 200 may be an interposer, heat spreader (see FIG. 11), redistribution structure, or combination thereof. As illustrated in FIG. 8, the lid 200 includes an interposer with a redistribution structure. The lid 200 is aligned to the package 100.

Where the lid 200 is an interposer, the lid 200 may include one or more substrate cores, collectively referred to as the substrate core 210. The substrate core 210 may be formed from a pre-impregnated composite fiber ("prepreg"), an insulating film or build-up film, paper, glass fiber, non-woven glass fabric, silicon, or the like. In some embodiments, the substrate core 210 is formed from a prepreg including glass fiber and a resin. In some embodiments, the substrate core 210 may be a copper-clad epoxy-impregnated glass-cloth laminate, a copper-clad polyimide-impregnated glass-cloth laminate, or the like. A conductive layer 206 may be one or more layers of copper, titanium, nickel, aluminum, compositions thereof, or the like, and may be formed using any appropriate process, such as by metal foil lamination, chemical vapor deposition (CVD), physical vapor deposition (PVD), and so forth. In some embodiments, the conductive layer 206 may be a foil which is thermally laminated to the substrate core 210. In some embodiments, the conductive layer 206 may be a redistribution structure similar to that described with respect to the first redistribution structure 106. Conductive connectors 226 may be formed on the conductive layer 206. A solder resist 224 may be formed to surround and protect the sides of the conductive connectors 226. Conductive vias 216 may provide signals from the conductive layer 206 to the opposite side of the lid 200. Another conductive layer 213 (which may be similar to conductive layer 206) may be used to provide signals from the conductive vias 216 to another device to be mounted atop the lid 200. The conductive vias 216, the conductive layer 206, and the conductive layer 213 may be formed from a conductive material such as copper, titanium, tungsten, aluminum, or the like. Another solder resist 224 may be used atop the lid 200 and openings may be formed therein to expose portions of the conductive layer 213.

Figure 9:
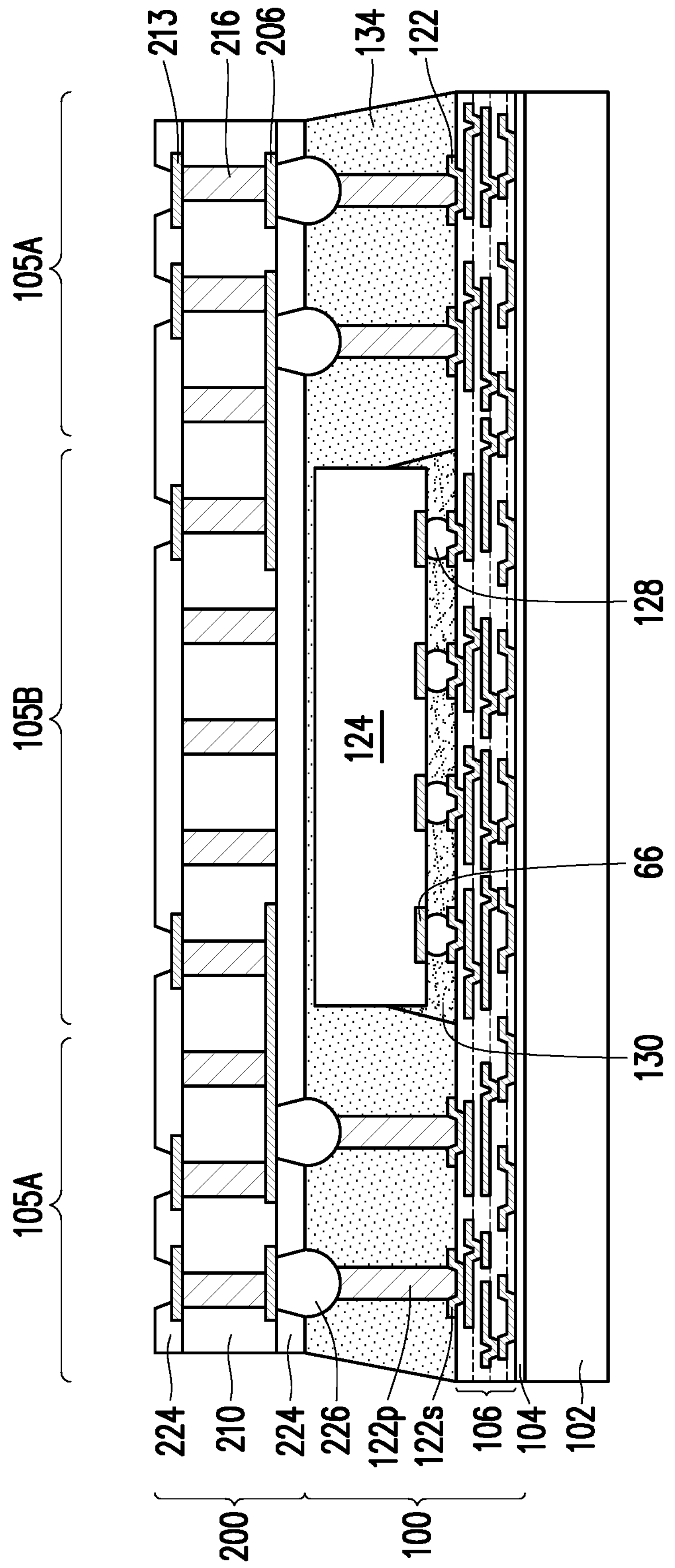

In FIG. 9, after the lid 200 is placed, the conductive connectors 226 are reflowed to form joints between corresponding ones of the conductive pillars 122*p* and the conductive layer 206, physically and electrically connecting the lid 200 to the first redistribution structure 106. An encapsulant 134 is formed on the various components. The encapsulant 134 may be a molding compound, epoxy, or the like, and may be applied by compression molding, transfer molding, or the like. The encapsulant 134 may be formed over the first redistribution structure 106 such that the integrated circuit die 124 is buried or covered and the space between the lid 200 and the first redistribution structure 106 is filled. The encapsulant 134 is then cured. In some embodiments, the encapsulant 134 is also formed between the first redistribution structure 106 and the integrated circuit die 124, for example, in embodiments where the underfill 130 is omitted. In some embodiments, the encapsulant 134 is formed prior to placing the lid 200 to help support the conductive pillars 122*p*.

Figure 10:
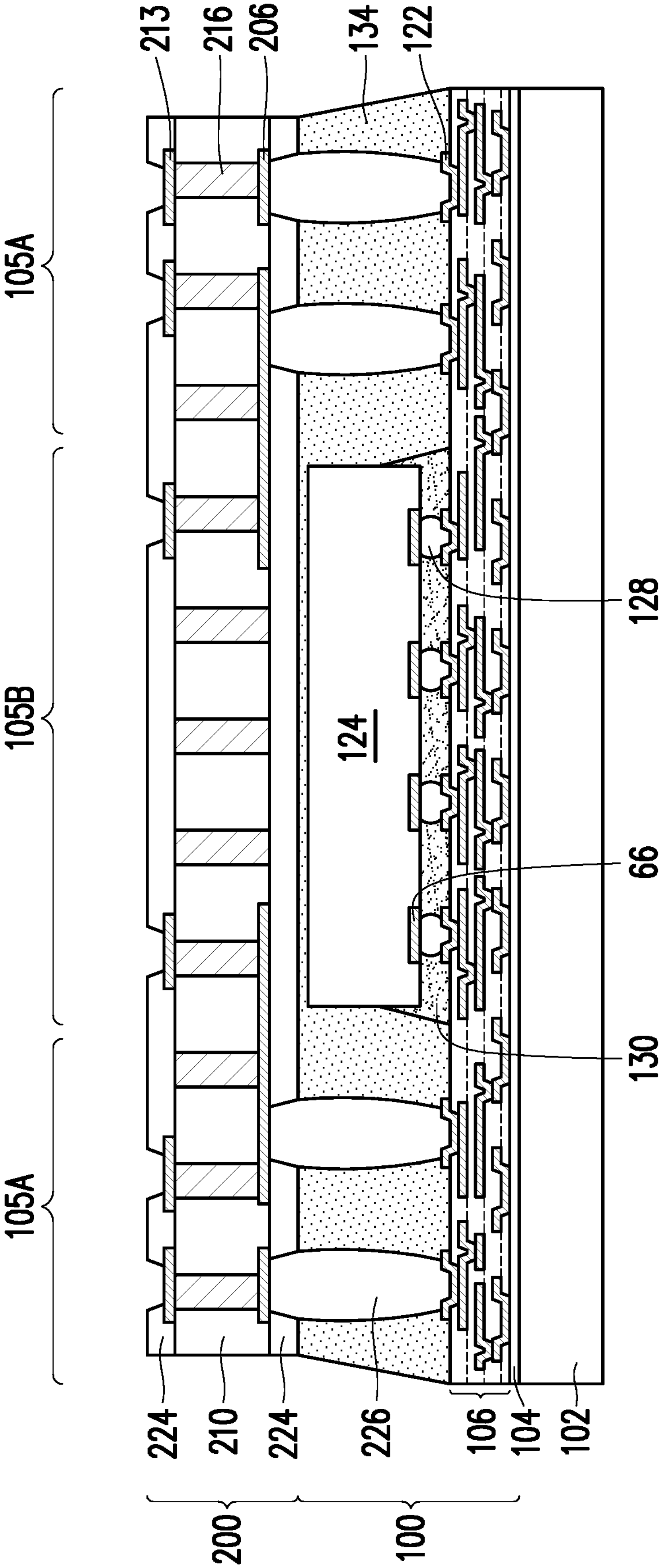

In FIG. 10, an embodiment is illustrated which omits the conductive pillars 122*p*, in accordance with some embodiments. In such embodiments the conductive connectors 226 may extend from the lid 200 to the UBMs 122 of the first redistribution structure 106. In some embodiments, the encapsulant 134 is formed prior to placing the lid 200 and holes formed therein for the conductive connectors 226. It should be understood that the embodiment omitting the conductive pillars 122*p* is not to scale and the conductive connectors 226 may be more spherical than as illustrated.

Figure 11:
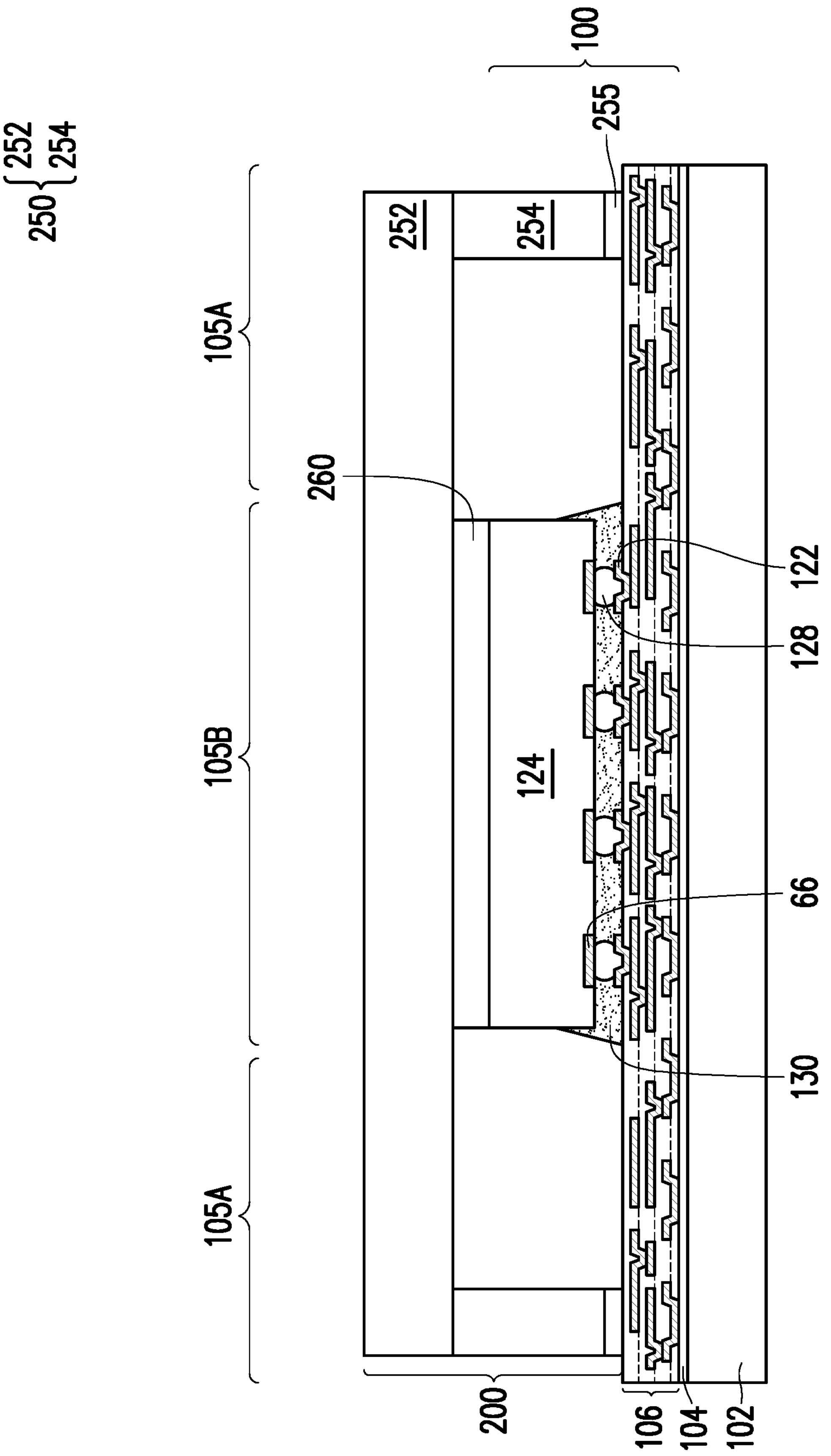

In FIG. 11, in embodiments where the lid 200 is a heat spreader 250, the conductive pillars 122*p* may be omitted as well as the UBMs 122. The heat spreader 250 may include an upper lid 252 and a ring 254 and may be mounted to the first redistribution structure 106 by a thermal adhesive 255. In addition, a thermal adhesive 260 may be used on the back surface of the circuit die 124. The heat spreader 250 may be made of a metal or metal alloy, such as aluminum, copper, aluminum nitride, and so forth. The thermal adhesive 255 and 260 may be any suitable adhesive, epoxy, underfill, die attach film (DAF), thermal interface material, or the like. The thermal adhesive 255 and 260 may be applied to a back-side of the integrated circuit die 124 or may be applied to an area of the upper lid 252.

The remaining intermediate steps will be illustrated where the lid 200 is a heat spreader 250, however, it should be understood that another lid-type may be used, such as discussed above.

Figure 12:
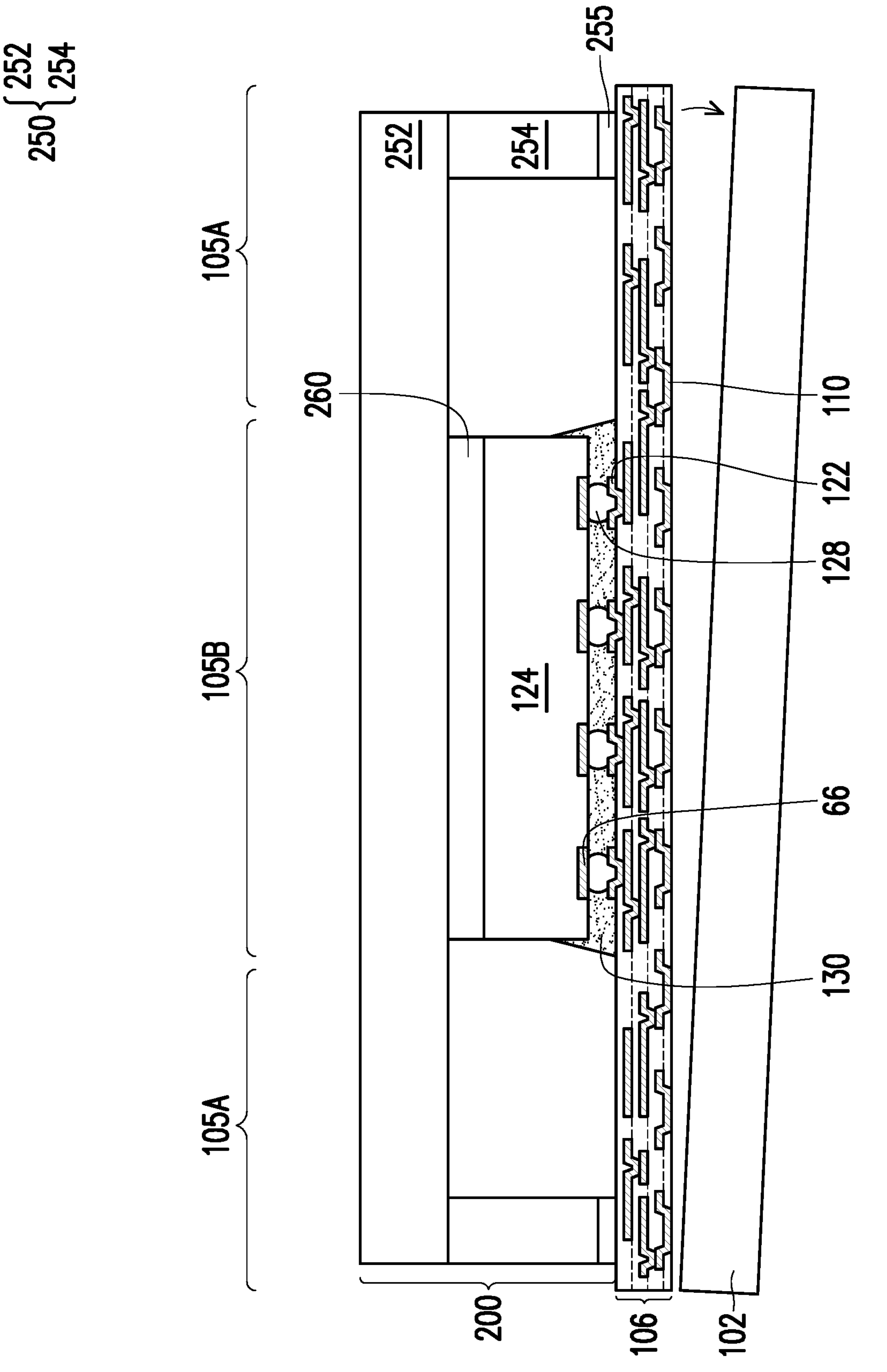

In FIG. 12, the carrier substrate 102 is removed. The carrier substrate 102 may be detached (or "de-bonded") from the first redistribution structure 106. In some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape. The de-bonding exposes the metallization patterns 110 of the first redistribution structure 106.

Figure 13:
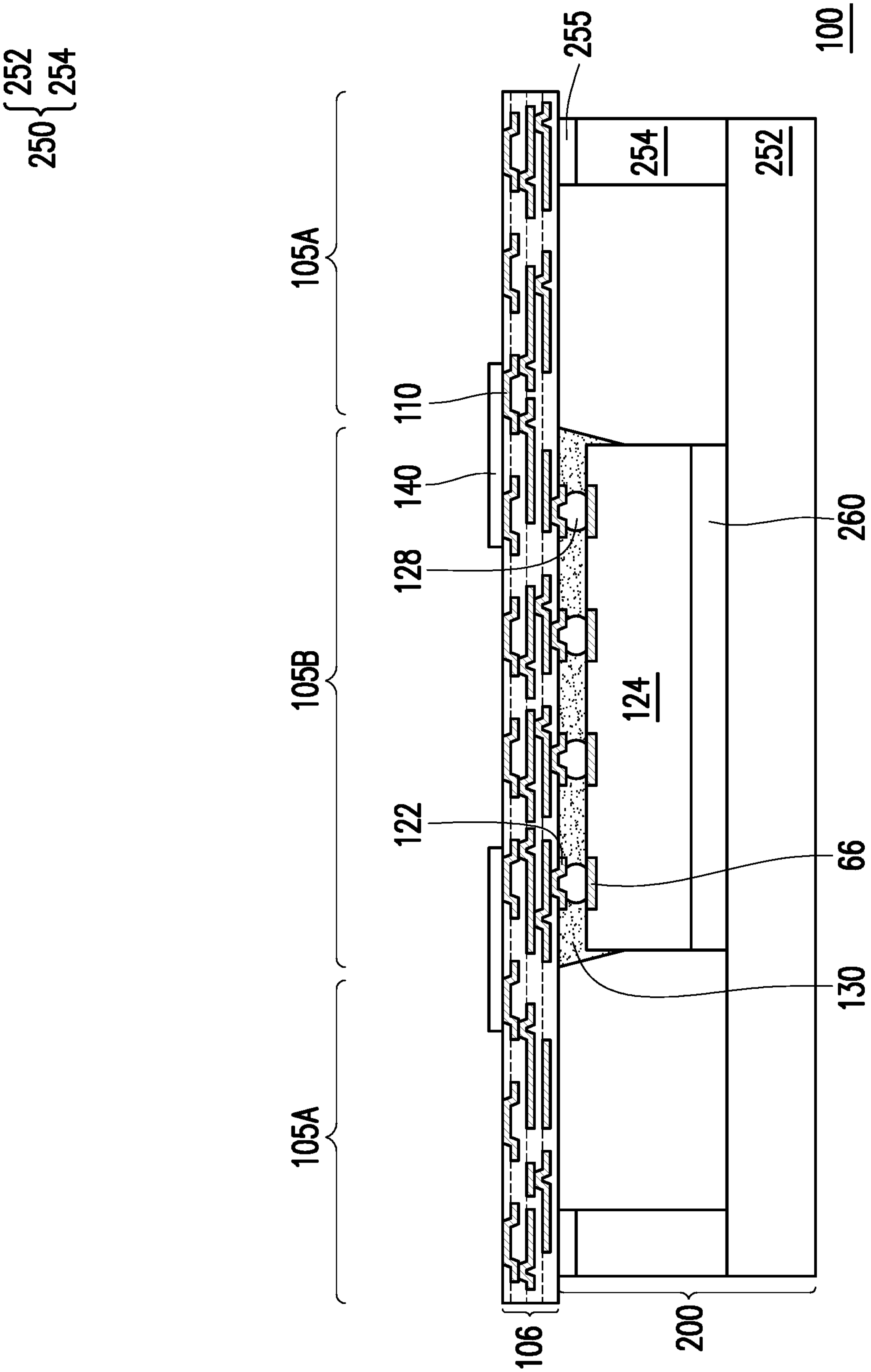

FIGS. 13 through 17 illustrate various configurations for using a ball mounted spacer, in accordance with some embodiments. In FIG. 13, optional devices 140, such as surface mount devices (SMDs), such as capacitors, resistors, regulators, power controllers, and so forth may be mounted to the surface of the first redistribution structure 106 and electrically coupled to one or more of the metallization patterns 110. The devices 140 may be placed by a pick and place process. In some embodiments, a passivation layer may be used over the metallization patterns 110 and patterned to expose a portion of the metallization patterns 110 prior to placing the devices 140. In some embodiments, UBMs may be formed over the exposed portions of the metallization patterns 110. In such embodiments, the UBMs may be formed using processes and materials similar to UBMs 122. In some embodiments, a solder paste may be deposited over the metallization patterns 110, such as over the portions of the metallization patterns 110 where the devices 140 are attached. In some embodiments, a reflow may be performed to physically and electrically couple the devices 140 to the metallization patterns 110.

Figure 14C:
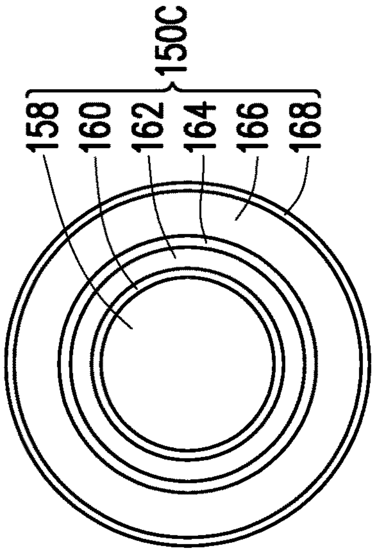
Figure 14B:
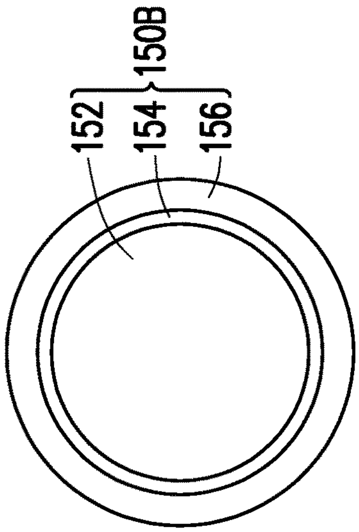
Figure 14A:
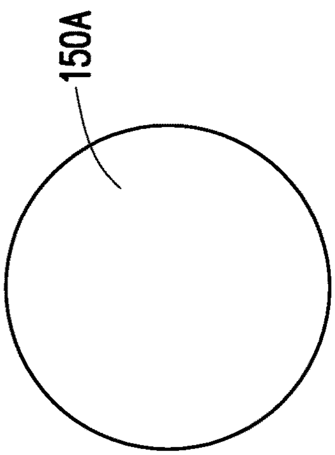

In FIGS. 14A, 14B, and 14C, different configurations for a ball-type spacer 150A, 150B, or 150C (or the spacer 150, in general (see FIG. 15)) are illustrated for use in maintaining spacing between the package 100 to another device while attaching the package 100 to the other device, both electrically and physically by the connector containing the spacer 150. In FIG. 14A, the spacer 150A is provided, which is a solid sphere. The core material of the spacer 150A may include any suitable material such as a metal (e.g., copper, silver, aluminum, gold, nickel, lead, bismuth, indium, etc.), a metal alloy (e.g., solder), a compound, a plastic, a ceramic, and so forth. The material of the spacer 150A is selected so that it has a higher melting point temperature over the reflow temperature of the other standard connectors (e.g., comprising solder or the like and being free from the spacer 150A). This will be described in greater detail below. The spacer 150A may have a diameter between about 30 μm and about 760 μm, though other dimensions are contemplated.

In FIG. 14B, a spacer 150B is provided which has a solid center core 152 which is coated with a first layer 154, which is coated with a second layer 156. In some embodiments, the first layer 154 may be omitted. The solid center core 152 may be any of the materials discussed above with respect to the spacer 150A and may have a diameter between about 30 μm and about 760 μm. The first layer 154 may be a barrier layer to prevent leeching from the material of the solid center core 152 into the surrounding material. The first layer 154 may be between about 0.5 μm and about 30 μm thick and may be made of any suitable materials such as nickel, titanium nitride, tantalum nitride, and so forth which is plated onto the solid center core 152 and surrounds the solid center core 152. The second layer 156 may include a eutectic material, such as a solder material, which is plated onto the first layer 154 or onto the solid center core 152 if the first layer 154 is omitted and surrounds the solid center core 152 and the first layer 154 (if used). In some embodiments, the second layer 156 may be between about 0.5 μm and about 30 μm thick. The material of the solid center core 152 is selected so that it has a higher melting point temperature over the reflow temperature of the other standard connectors (e.g., comprising solder or the like and being free from the spacer 150B). The material of the second layer 156 may have a reflow temperature similar to the reflow temperature of the other standard connectors so that the second layer 156 can reflow. As such, the material of the second layer 156 is different than the material of the solid center core 152.

In FIG. 14C, a many layered spacer 150C is illustrated, in accordance with some embodiments. In FIG. 14C, a solid center core 158 may be coated with several additional layers. In some embodiments, the solid center core 158 may be coated by a first barrier layer 160, then a conductive layer 162, followed by a second barrier layer 164, so that the conductive layer 162 is sandwiched between two barrier layers. Following forming the second barrier layer 164, a solder layer 166 may be coated over the second barrier layer 164. In some embodiments, the solder layer 166 may be doped with another material forming a doped sublayer 168 of the solder layer 166. In some embodiments, the solid center core 158 may be a plastic core, though any of the other candidate materials such as those discussed above with respect to spacer 150A may be used. The first barrier layer 160 and the second barrier layer 164 may be made of the same material or a different material and can be any suitable barrier material, such as nickel, titanium nitride, tantalum nitride, and so forth. The conductive layer 162 may include any suitable conductive material, such as copper, aluminum, silver, or a combination, thereof, or the like. The solder layer 166 may be any suitable solder material, such as a tin-silver composite. The doped sublayer 168 may include nickel or another suitable material as a dopant to reduce oxidation of the outer layer of the spacer 150C. The material of the solid center core 158 and/or conductive layer 162 is selected so that it has a higher melting point temperature over the reflow temperature of the other standard connectors (e.g., comprising solder or the like and being free from the spacer 150C).

The spacers 150A, 150B, or 150C include a core material which has a higher melting point temperature. In some embodiments, the core material can be a solder material, so long as the other connectors (e.g., conductive connectors 170 of FIG. 15) have a melting point which is less than the melting point of the core material. For example, if the connectors are a silicon bismuth solder ball, the reflow temperature is about 170° C. A solder alloy of tin, silver, and copper (e.g., 96.5%, 3%, and 0.5%, respectively) is available for the core material of the spacers 150A, 150B, or 150C with a reflow temperature of about 217° C. Thus, the solder connectors can be heated to reflow to make the connection without reflowing the core material of the spacers 150A, 150B, or 150C. In general, the melting point of the core material should be at least about 30 to 50° C. higher than the melting point of the material of the other conductive connectors 170 (see FIG. 15). Similarly, where the spacers 150B or 150C are used, which include an outer solder layer, such as the second layer 156 of spacer 150B or solder layer 166 of spacer 150C, the melting point of the core material should be at least about 30 to 50° C. higher than the melting point of the outer solder layer (e.g., second layer 156 of spacer 150B or solder layer 166 of spacer 150C).

Figure 15:
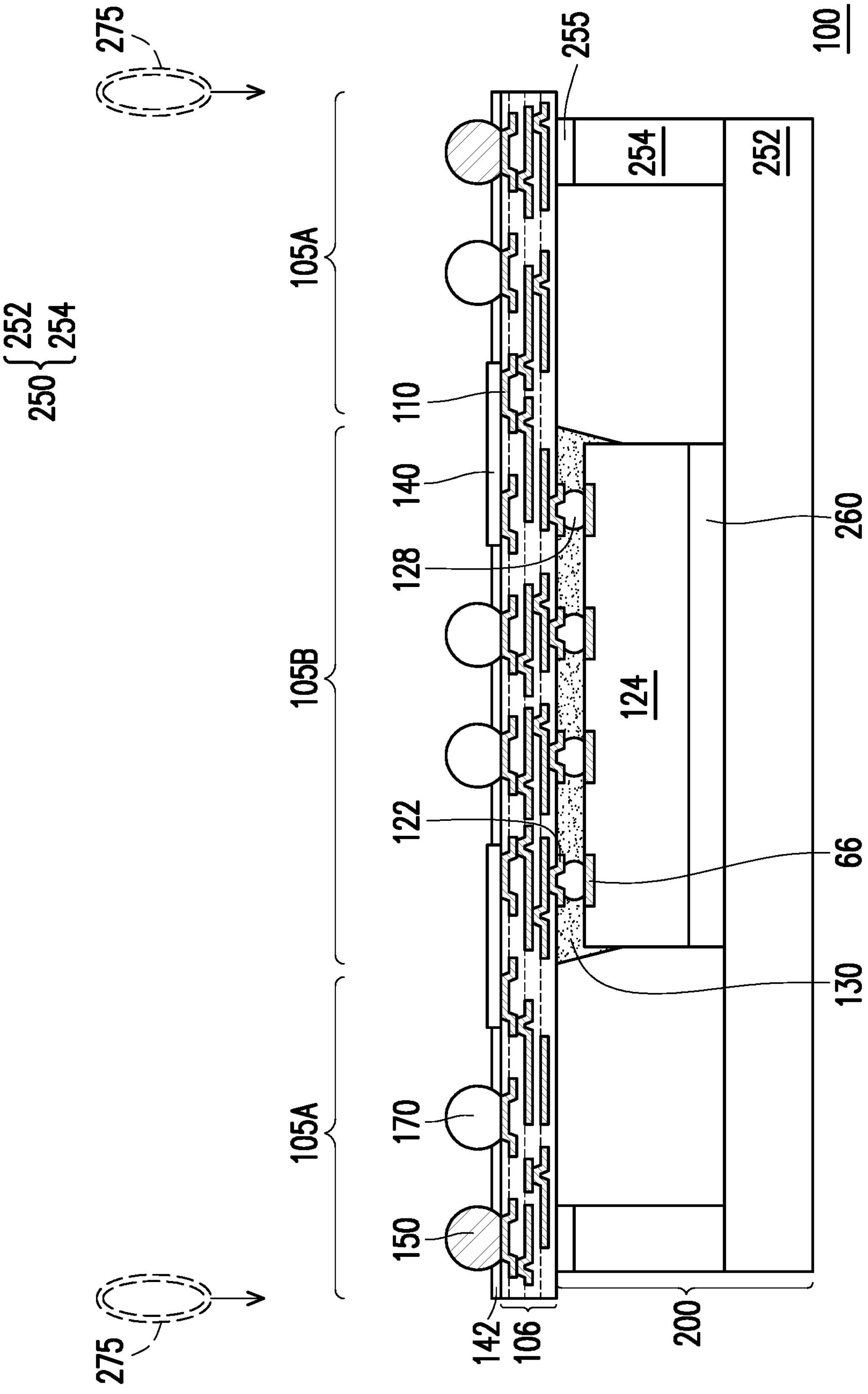

In FIG. 15, conductive connectors 170 are formed over the first redistribution structure 106. The conductive connectors 170 contact the exposed portions of the metallization patterns 110. In some embodiments, as noted above, a passivation layer 142 may be used over the metallization patterns 110 and patterned to expose a portion of the metallization patterns 110 prior to forming the conductive connectors 170. Also as noted above, in some embodiments, UBMs may be formed over the exposed portions of the metallization patterns 110.

In some embodiments, a solder material (e.g., solder portion 151 of FIG. 30) such as a solder paste or solder pad may be deposited or plated over the metallization patterns 110, in particular in embodiments which use spacer 150A, being a solid ball. The solder material can be reflowed during ball mounting to attach the spacers 150. The conductive connectors 170 and spacers 150 may be deposited using a ball grid array (BGA) process. The conductive connectors 170 may include a conductive material such as solder, copper, aluminum, gold, nickel, silver, palladium, tin, the like, or a combination thereof. In some embodiments, the conductive connectors 170 are solder connectors that are formed by initially forming a layer of solder through such commonly used methods such as evaporation, electroplating, printing, solder transfer, ball placement, or the like. In one embodiment, the spacers 150 and solder for the conductive connectors 170 may be pressed in a form to the surface of the metallization patterns 110 (or UBMs) and a reflow may be performed in order to shape the material into the desired bump shapes for the conductive connectors 170 and attach the conductive connectors 170 and spacers 150 to the metallization patterns 110.

The reflow attaching the conductive connectors 170 may also reflow solder materials disposed on the metallization patterns 110 (or UBMs) for attaching the spacers 150, such as the case where the spacers 150 include the spacer 150A, which does not include any solder material. In other embodiments, the reflow may melt an outer solder layer (e.g., second layer 156 of spacer 150B or solder layer 166 of spacer 150C) of the spacers 150 to attach the spacers 150 to the metallization patterns 110 (or UBMs).

In some embodiments, if not already performed, the reflow may also physically and electrically couple the devices 140 to the metallization patterns 110. Other suitable processes may also be used. In some embodiments, after forming the conductive connectors 170 and placing the spacers 150, the structure may be flipped over and placed on a tape or secured by the spacers 150 and the conductive connectors 170 and singulated into dies. In other embodiments, package 100 may be singulated directly on a tape without flipping the structure over.

Figure 16:
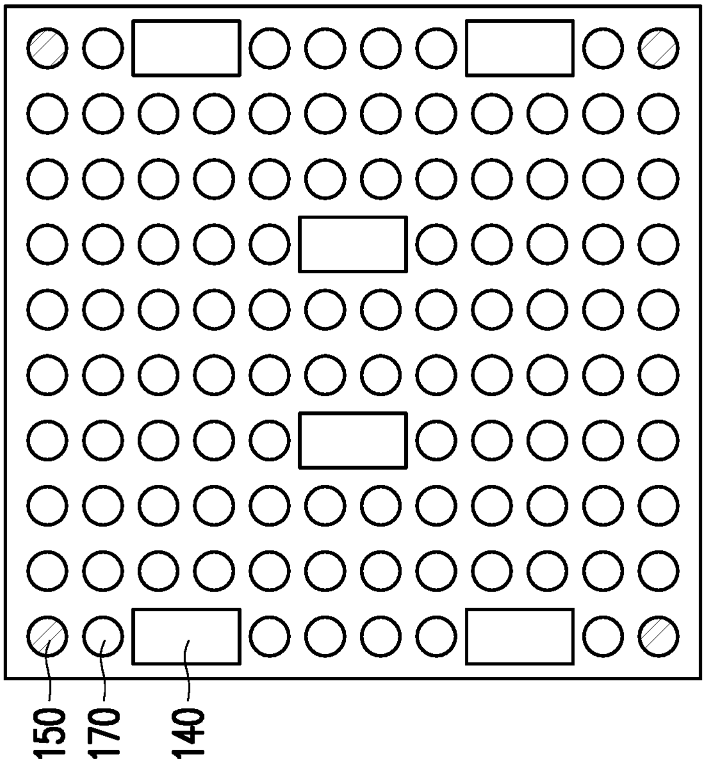

As shown in FIG. 15, the spacers 150 may be placed at the corners of the package 100. The conductive connectors 170 are placed in the remaining connecting positions. FIG. 16 illustrates a top down view of the package 100 of FIG. 15, illustrating connectors with spacers 150 being positioned in the corners and conductive connectors 170 being positioned in the other connectors.

Also illustrated in FIG. 15, following the placement of the conductive connectors 170 and the connectors having spacers 150, the package 100 may be singulated from any adjacent packages. Accordingly, several packages corresponding to package 100 may be formed at the same time. A singulation process 275 is performed by sawing along scribe line regions, e.g., between the region corresponding to the package 100 and a second package region adjacent to the package 100. The sawing singulates the package 100 from adjacent second packages. In some embodiments, the singulation process 275 is performed after the package substrate 300 is coupled to the package 100 (discussed below).

Figure 17:
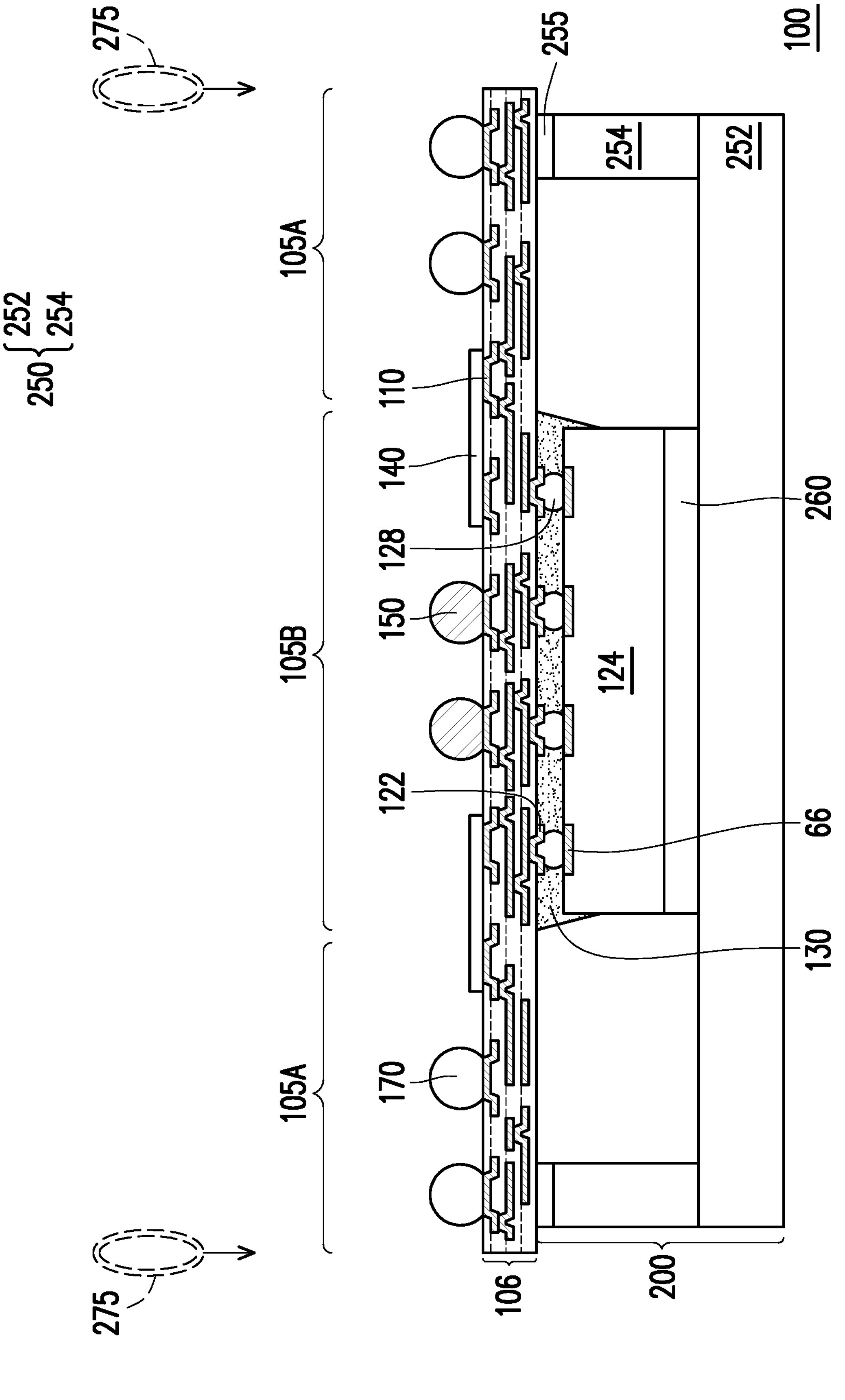
Figure 18B:
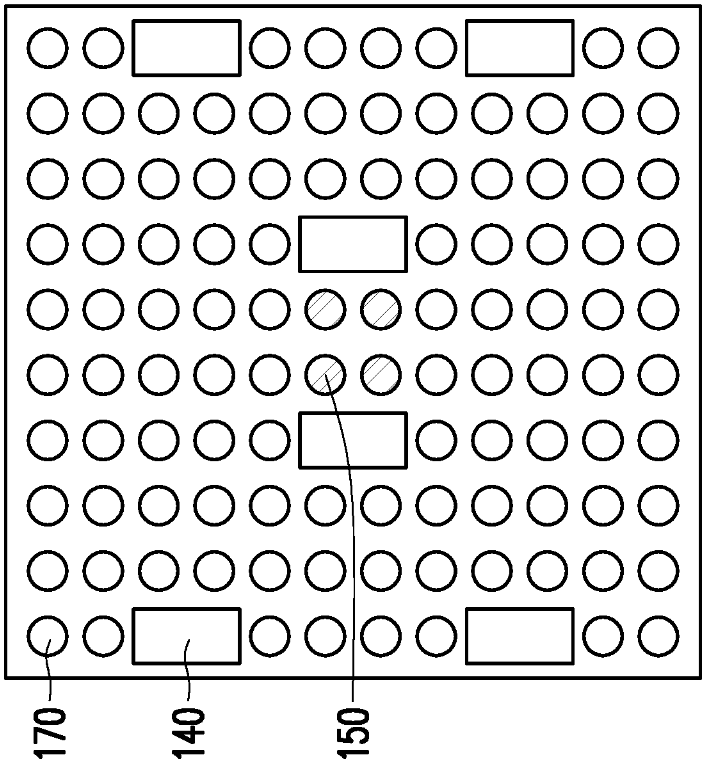
Figure 18A:
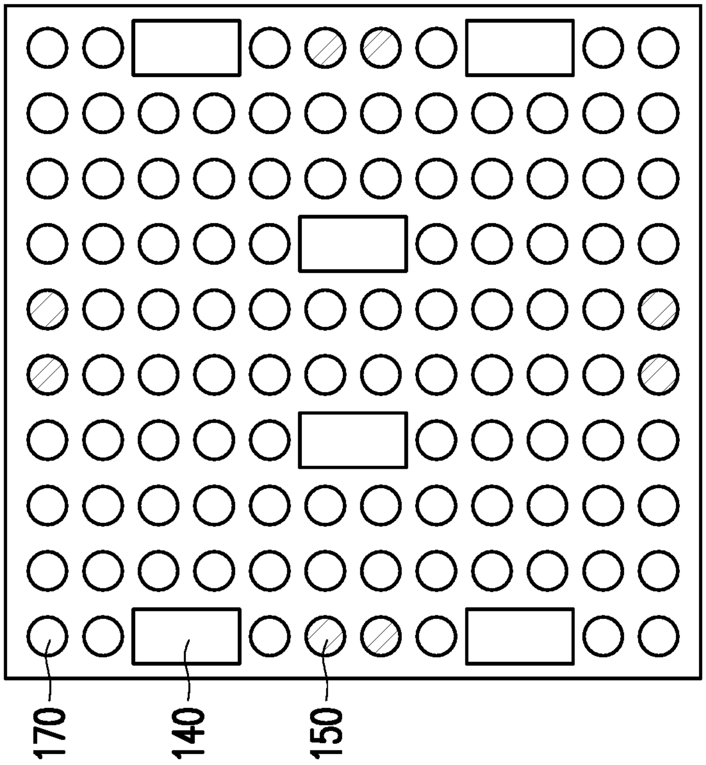

FIG. 17 is similar to FIG. 15, where like reference numbers indicate like elements formed using like processes, except that the spacers 150 are illustrated as being placed at the center of an edge of the package 100, in accordance with some embodiments. In other embodiments, the spacers 150 are at the center of the package and the view in FIG. 17 is a cross section of the middle of the package 100. FIG. 18A illustrates a top down view of the package 100 of FIG. 17. In FIG. 18A, the spacers 150 are positioned on opposite sides of the package 100 in the middle of the row. In some embodiments, the spacers 150 may be positioned on all four edges. In FIG. 18B, the spacers 150 are positioned in the center of the package 100 and not along any of the edges of the package 100. The layout of the placement of the spacers 150 from FIGS. 18A and 18B may also be combined. The singulation process 275, such as described above with respect to FIG. 15, may be performed following the formation of the connectors having spacers 150 and conductive connectors 170.

Figure 19:
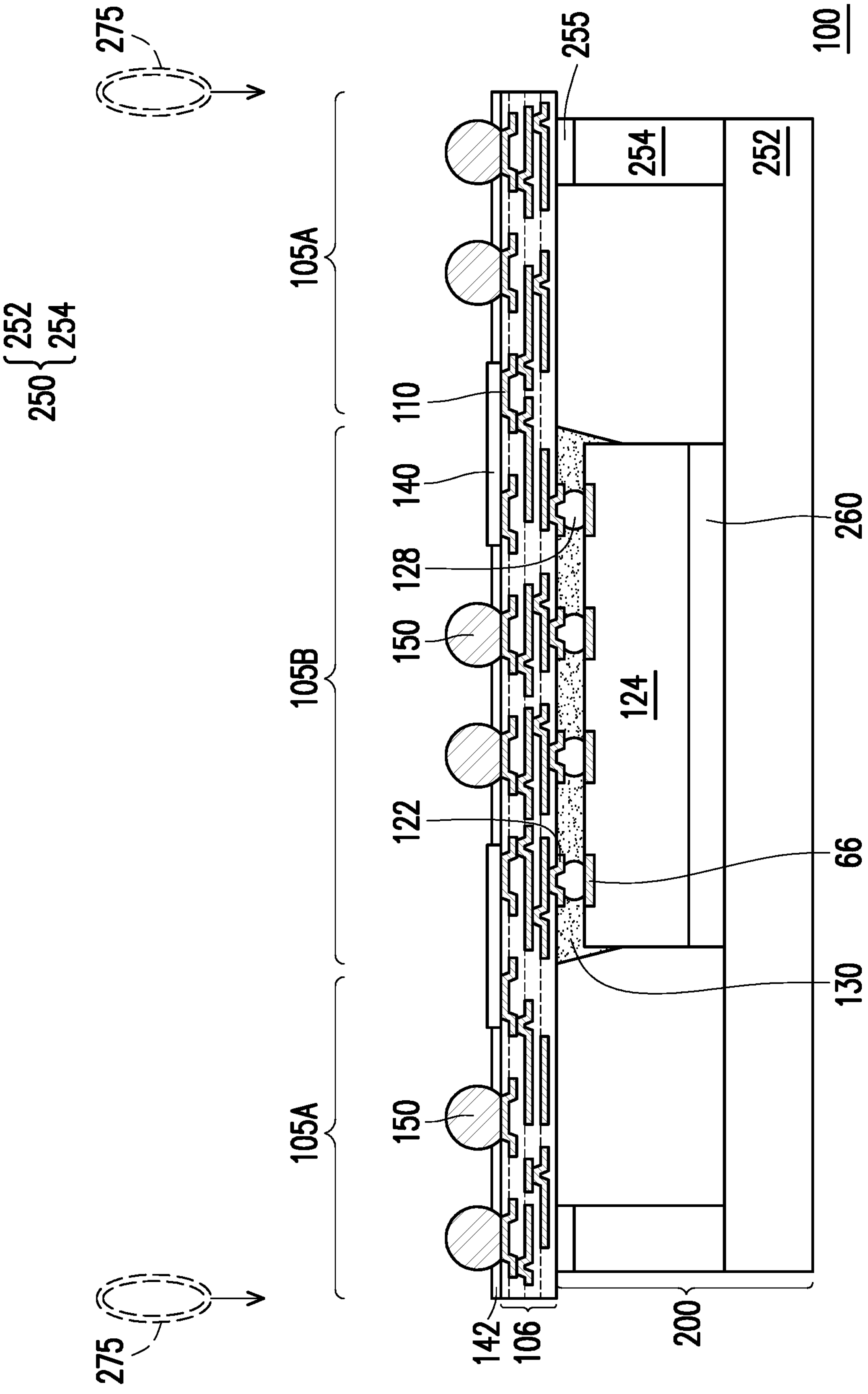
Figure 20B:
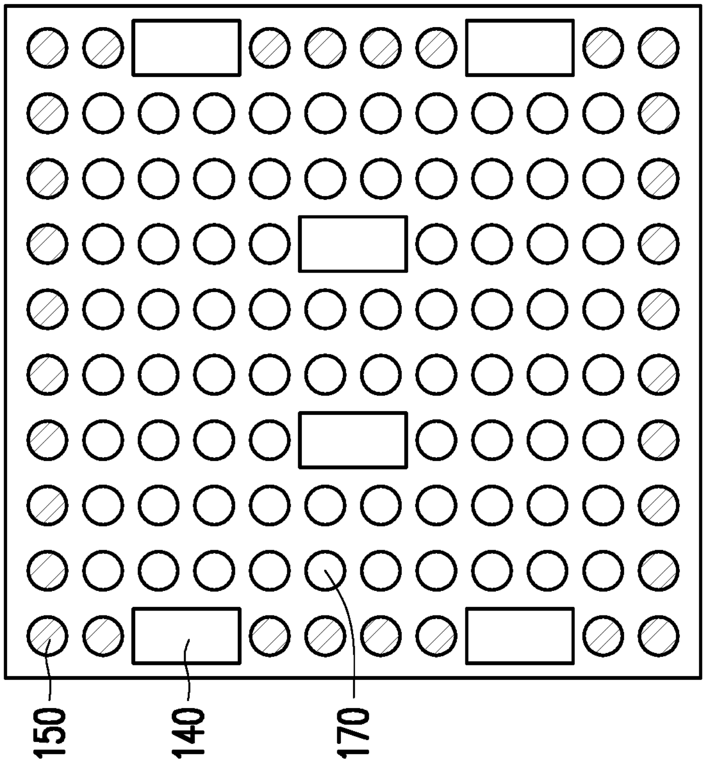
Figure 20A:
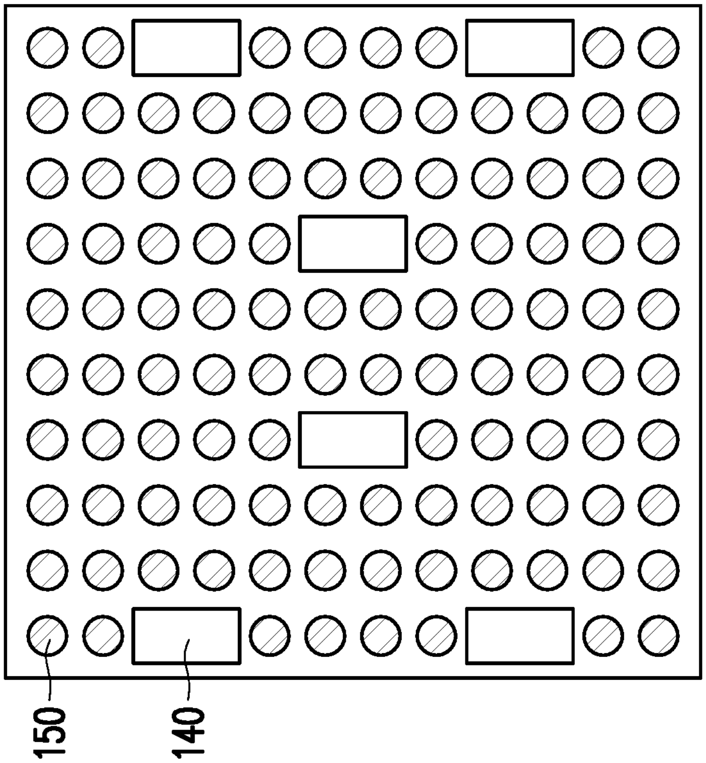

FIG. 19 is similar to FIG. 15, where like reference numbers indicate like elements formed using like processes, except that the spacers 150 are illustrated as being placed at all the connector positions in the row. FIG. 20A illustrates that the spacers 150 may be placed at all the connector positions for each connector of the package 100. FIG. 20B illustrates that the spacers 150 may be placed at all the connector positions around the edge of the package 100. It should be understood that these layouts for the spacers 150 may be combined. The singulation process 275, such as described above with respect to FIG. 15, may be performed following the formation of the connectors having spacers 150 and conductive connectors 170.

Figure 21A:
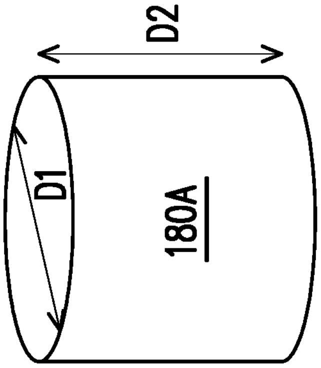
Figure 21B:
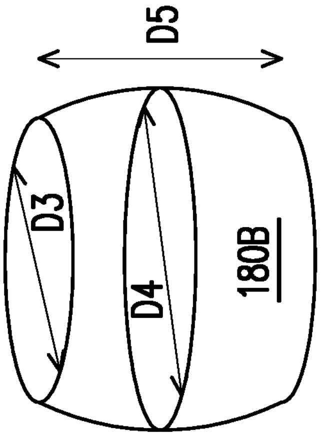
Figure 21C:
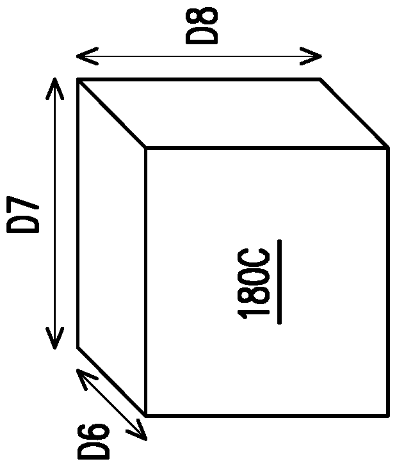

FIGS. 21A, 21B, and 21C illustrate spacer blocks 180A, 180B, and 180C (in general referred to as spacer blocks 180, see FIG. 22), in accordance with other embodiments. Spacer blocks 180 may be formed in different shapes. For example in FIG. 21A, spacer block 180A is a column; in FIG. 21B, spacer block 180B is a squashed column or expanded column; and in FIG. 21C, spacer block 180C is a cube or rectangular prism. Other prisms and shapes are contemplated. Spacer blocks 180 have a flat upper surface and a flat lower surface so that they can be placed using a pick and place process. The dimensions of the spacer blocks 180A, 180B, or 180C may vary. Each of the dimensions illustrated in FIGS. 21A, 21B, and 21C may be any suitable dimensions. The dimension D1 is the diameter of the spacer block 180A, and the dimension D2 is the height of the spacer block 180A. The dimension D3 is the diameter of the spacer block 180B at an upper surface of spacer block 180B. The dimension D4 is the diameter of the spacer block 180B at a center or fattest part of the spacer block 180B. The dimension D5 is the height of the spacer block 180B. The dimensions D6 and D7 are the depth and width, respectively, of the spacer block 180C, and the dimension D8 is the height of the spacer block 180C. In some embodiments, each of the dimensions D1, D2, D3, D4, D5, D6, D7, and D8 may be in a range of about 80 μm and about 1.5 mm, such as about 200 μm. Each of the dimensions D1, D2, D3 or D4, D5, D6, D7, and D8 may each be different from each other or may be the same, or may be a combination of different dimensions and the same dimensions. As illustrated in FIG. 21B, however, the dimension D4 is greater than D3. In another embodiment, the dimension D4 may be less than the dimension D3 and the resulting shape is a narrowed column or hour glass shape. In one embodiment, the spacer block 180B can be combined with the spacer block 180C to provide a spacer block 180 that bulges at the middle.

The material of the spacer blocks 180 may include any suitable material such as a metal (e.g., copper, silver, aluminum, etc.), a metal alloy, a compound, a plastic, a ceramic, and so forth. Similar to the spacers 150, the material of the spacer blocks 180 should be selected so that it has a higher melting point temperature over the reflow temperature of the other standard conductive connectors. In some embodiments, the spacer blocks 180 may include a solder material layer disposed over and/or under and/or around a core material of the spacer blocks 180. In some embodiments, the spacer blocks 180 may include additional barrier layers surrounding the core material of the spacer blocks 180, similar to that described above with respect to the spacer 150B and/or spacer 150C of FIGS. 14B and 14C, respectively.

Figure 22:
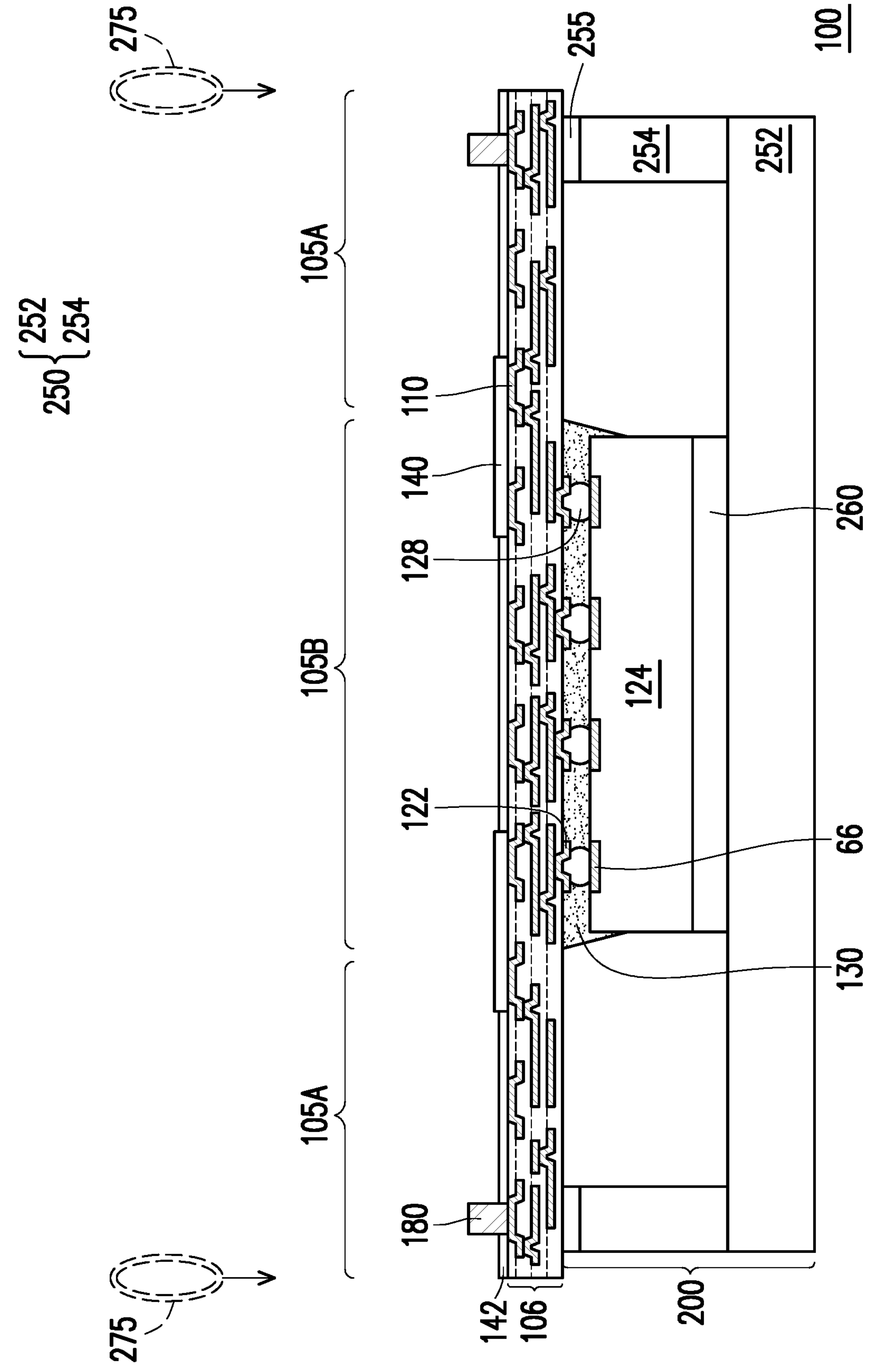

In FIG. 22, the spacer blocks 180 are positioned using a pick and place process at the same time the devices 140 (such as described above with respect to FIG. 13) are placed. Also as noted above, some embodiments may use a patterned passivation layer 142 or UBMs over portions of the metallization patterns 110. A solder material (e.g., upper solder portion 182 of FIG. 37), such as a solder paste or solder pad may be deposited or plated over the metallization patterns 110, and may be used on portions of the metallization patterns 110 where the spacer blocks 180 and devices 140 (if any) are to be attached. After the spacer blocks 180 and devices 140 are placed, a reflow of the solder materials may be performed to physically and electrically couple the spacer blocks 180 and devices 140 to the metallization patterns 110.

Figure 23:
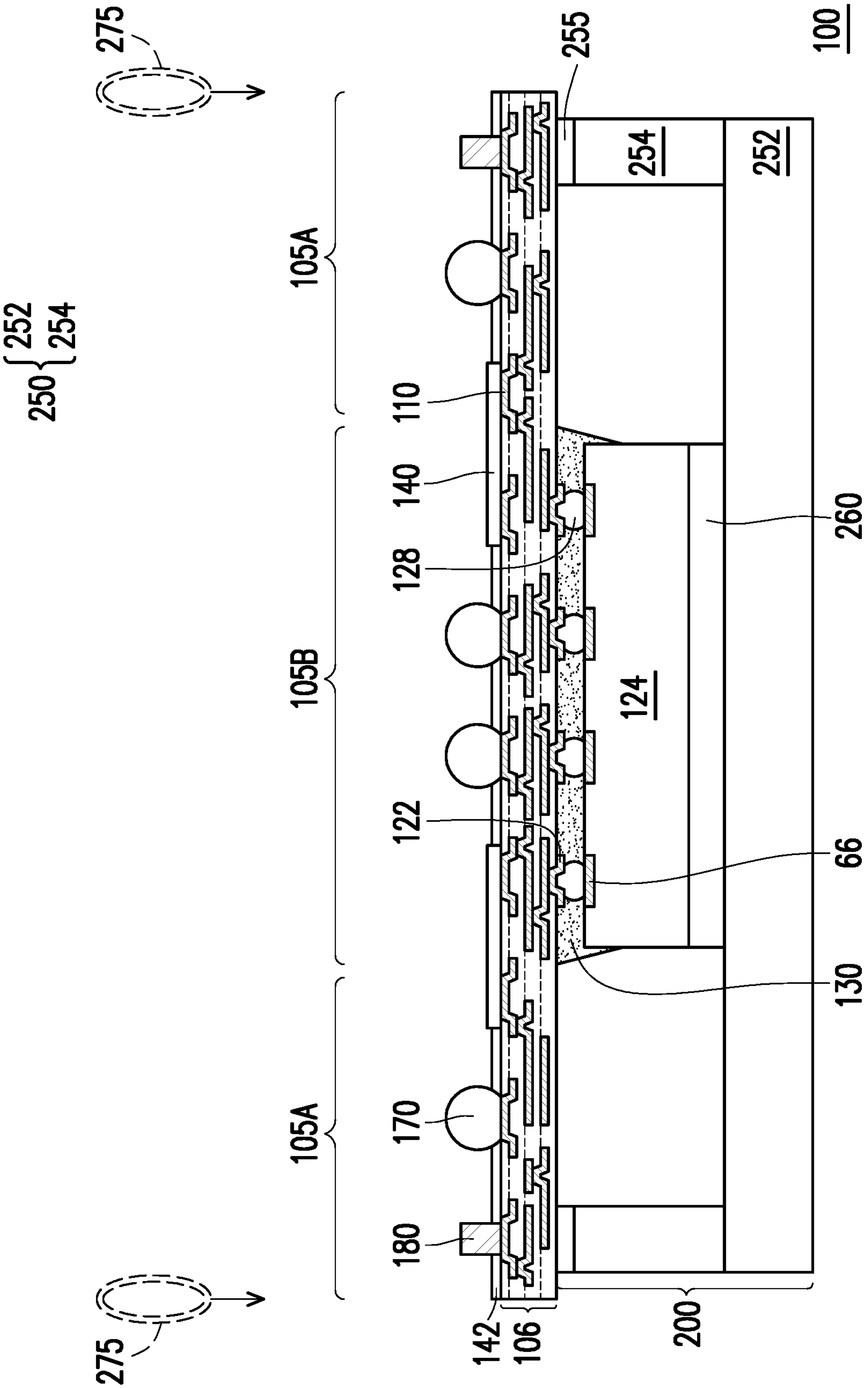

In FIG. 23, the conductive connectors 170 may be formed on the remaining portions of the metallization patterns 110. The conductive connectors 170 may be formed using processes and materials similar to those described above with respect to the conductive connectors 170 of FIG. 15.

Figure 24:
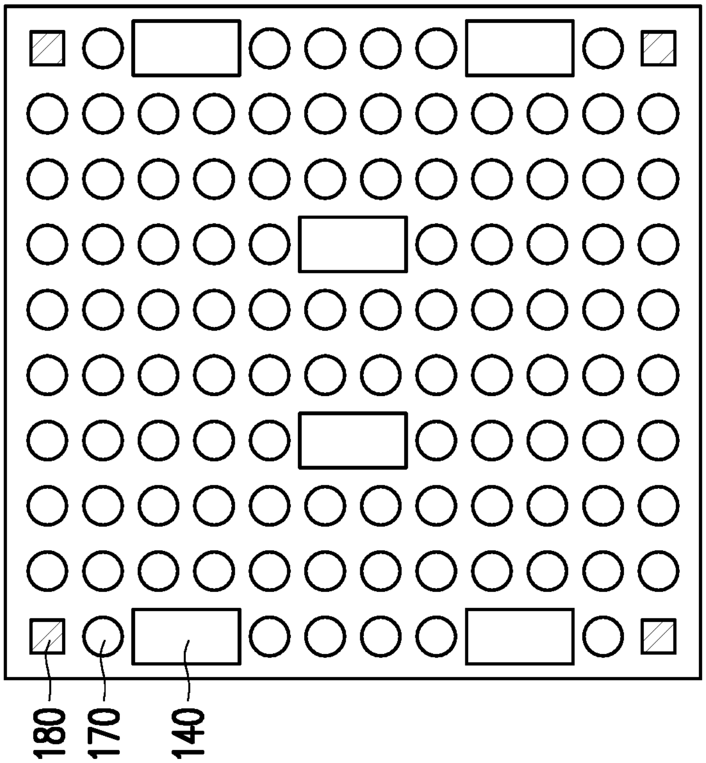

As shown in FIG. 23, the spacer blocks 180 may be placed at the corners of the package 100. The conductive connectors 170 are placed in the remaining connecting positions. The singulation process 275, such as described above with respect to FIG. 15, may be performed following the formation of the connectors having spacer blocks 180 and conductive connectors 170. FIG. 24 illustrates a top down view of the package 100 of FIG. 23, illustrating connectors with the spacer blocks 180 positioned at corners of the package 100 and conductive connectors 170 positioned in the other connectors.

Figure 25:
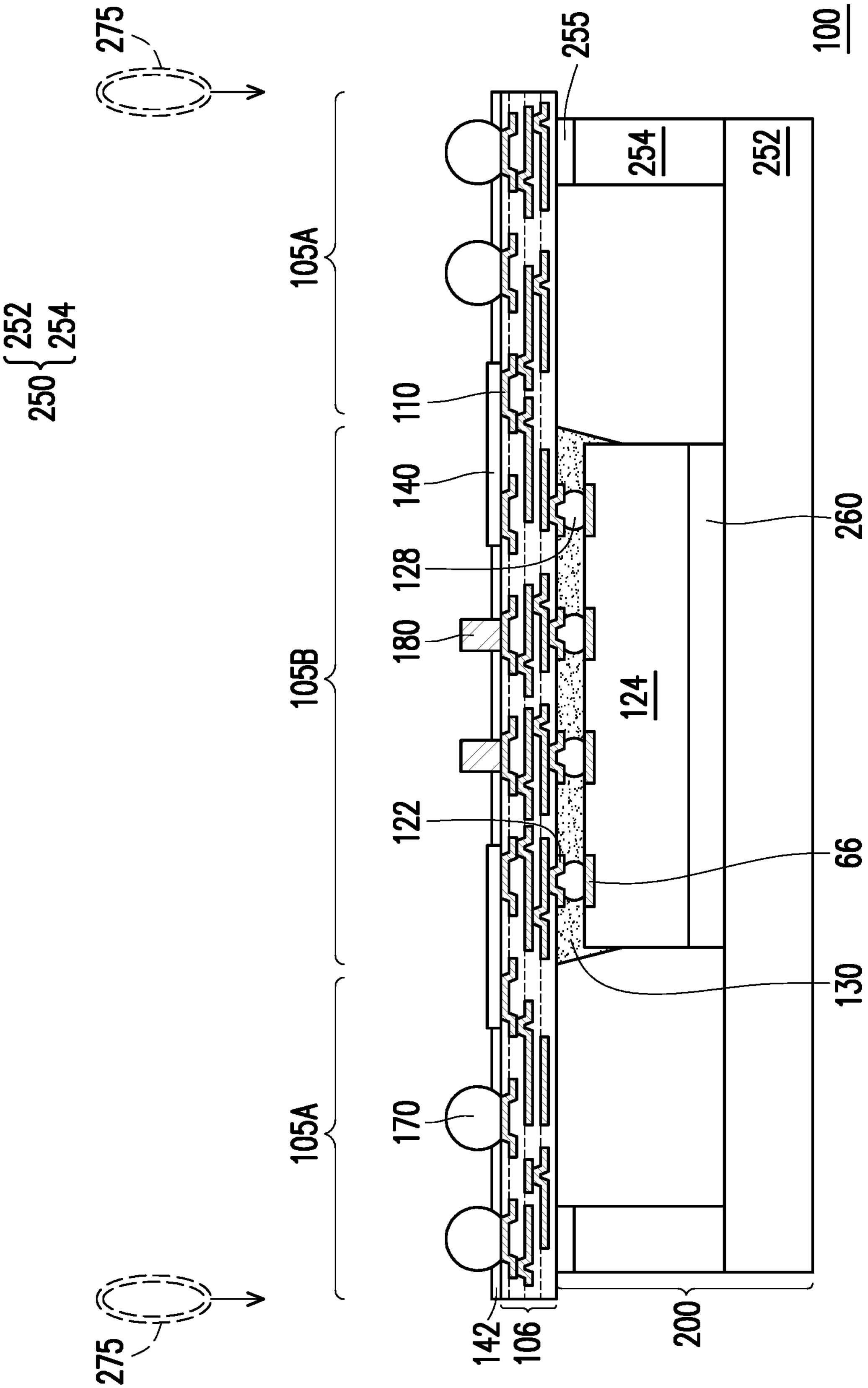
Figure 26B:
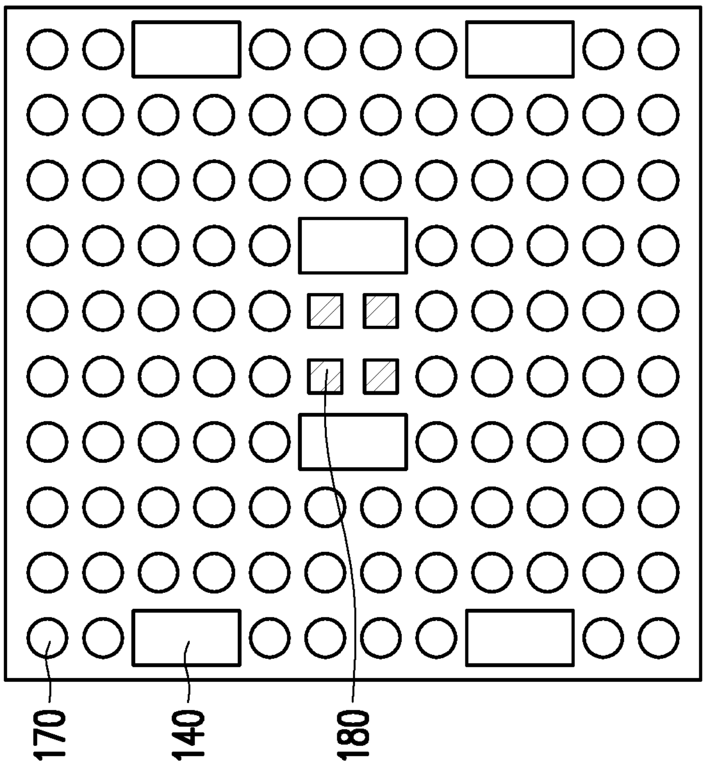
Figure 26A:
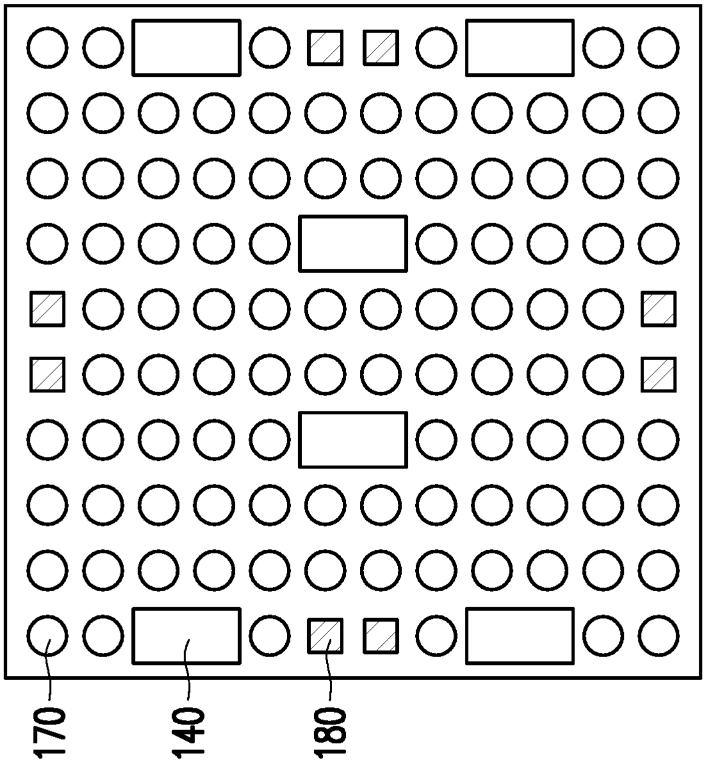

FIG. 25 is similar to FIG. 23, where like reference numbers indicate like elements formed using like processes, except that the spacer blocks 180 are illustrated as being placed at the center of an edge of the package 100, in accordance with some embodiments. In other embodiments, the spacer blocks 180 are at the center of the package and the view in FIG. 25 is a cross section of the middle of the package 100. FIG. 26A illustrates a top down view of the package 100 of FIG. 25. In FIG. 26A, the spacer blocks 180 are positioned on opposite sides of the package 100 in the middle of the connector row. In some embodiments, the spacer blocks 180 may be positioned on all four edges. In FIG. 26B, the spacer blocks 180 are positioned in the center of the package 100 and not along any of the edges of the package 100. The layout of the placement of the spacer blocks 180 from FIGS. 26A and 26B may also be combined. The singulation process 275, such as described above with respect to FIG. 15, may be performed following the formation of the connectors having spacer blocks 180 and conductive connectors 170.

Figure 27:
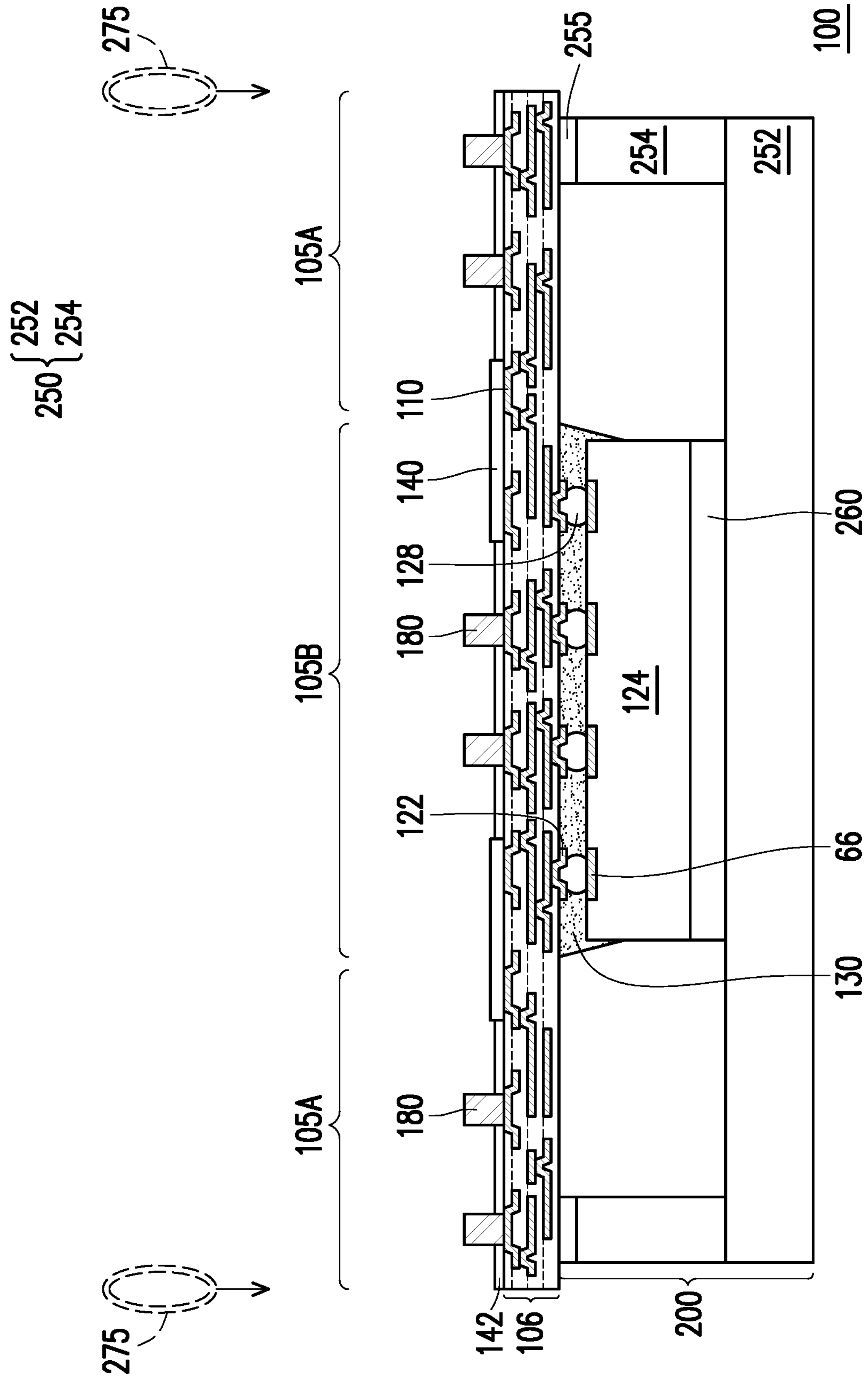
Figure 28B:
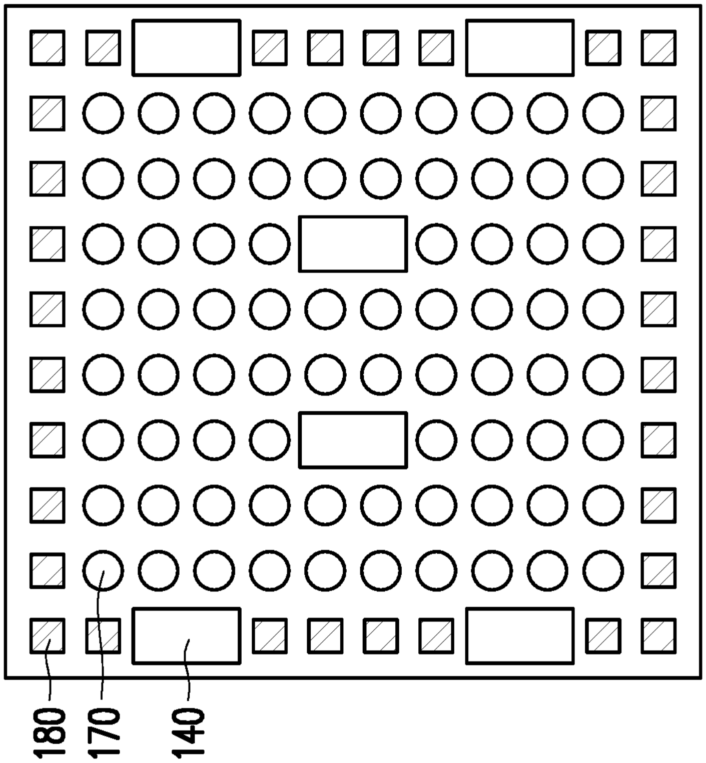
Figure 28A:
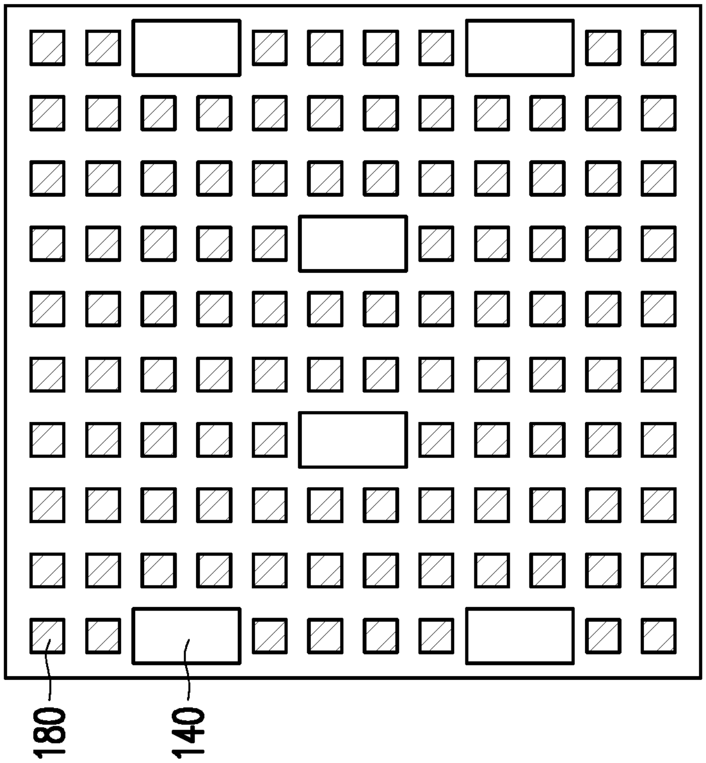

FIG. 27 is similar to FIG. 23, where like reference numbers indicate like elements formed using like processes, except that the spacer blocks 180 are illustrated as being placed at all the connector positions in the row. FIG. 28A illustrates that the spacer blocks 180 may be placed at all the connector positions for the each connector of the package 100. FIG. 28B illustrates that the spacer blocks 180 may be placed at all the connector positions around the edge of the package 100. It should be understood that these layouts for the spacer blocks 180 may be combined. The singulation process 275, such as described above with respect to FIG. 15, may be performed following the formation of the connectors having spacer blocks 180 and conductive connectors 170.

Figure 29:
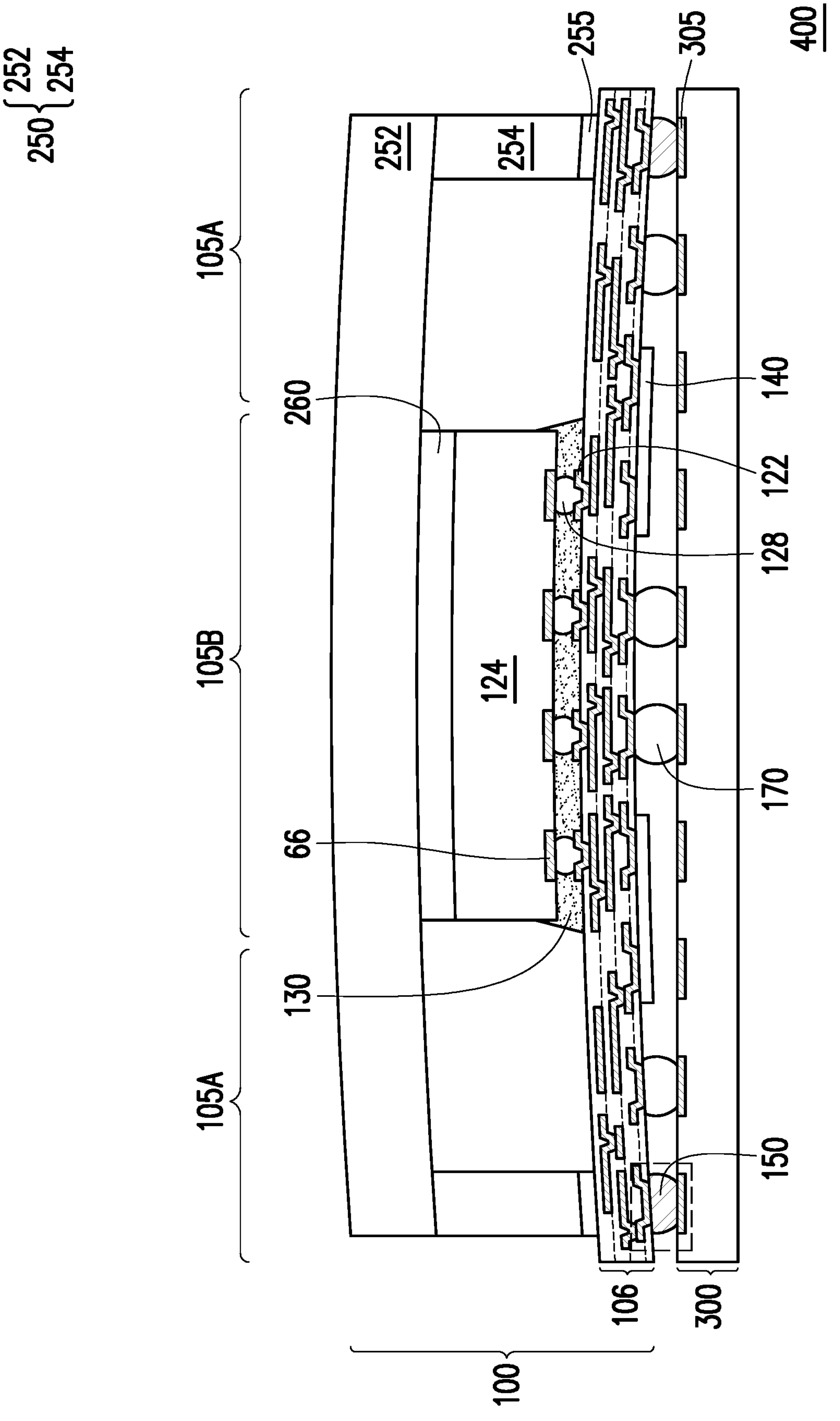
FIGS. 29 through 42 illustrate various intermediate steps in the process of attaching an integrated fan-out package to a package substrate using spacers embedded in some of the connectors.

In FIG. 29, the package 100 may be mounted to a package substrate 300 using conductive connectors 170 and the connectors using spacer 150 to form 3D package 400. As illustrated in FIG. 29, the package 100 has warpage in a crying or frown shape. When the package 100 is attached to the package substrate 300, the spacers 150 located at the corners of the package 100 provides a minimum distance between the package 100 and the package substrate 300 so that the conductive connectors 170 do not expand too much toward each other to cause bridging errors.

The package substrate 300 may be an interposer, a printed circuit board (PCB), another package, and so forth. The package substrate 300 may include active and passive devices (not shown). As one of ordinary skill in the art will recognize, a wide variety of devices such as transistors, capacitors, resistors, combinations of these, and the like may be used to generate the structural and functional requirements of the design for the package substrate 300. The devices may be formed using any suitable methods.

The package substrate 300 may also include metallization layers and vias (not shown) and contact pads 305 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 300 is substantially free of active and passive devices.

The conductive connectors 170 are reflowed to attach the package 100 to the contact pads 305 of package substrate 300. The conductive connectors 170 electrically and/or physically couple the package substrate 300, including metallization layers in the package substrate 300, to the first redistribution structure 106 of the package 100. When the conductive connectors 170 are reflowed, a reflow temperature is selected such that the core material of the spacer 150 is not melted. However, the spacer 150 is also attached as a conductive connector between the package 100 and the package substrate 300. The dashed box in FIG. 29 is magnified and illustrated in greater detail in FIGS. 30 and 31.

In some embodiments, an underfill (not shown) may be formed between the package 100 and the package substrate 300 and surrounding the conductive connectors 170 and the connectors using spacer 150. The underfill may be formed by a capillary flow process after the package 100 is attached or may be formed by a suitable deposition method before the package 100 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 30:
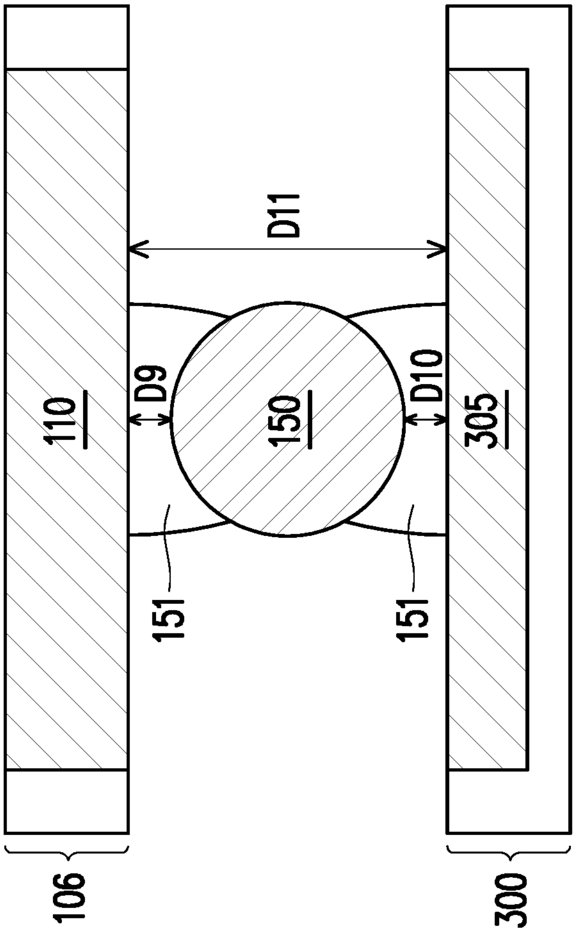
Figure 31:
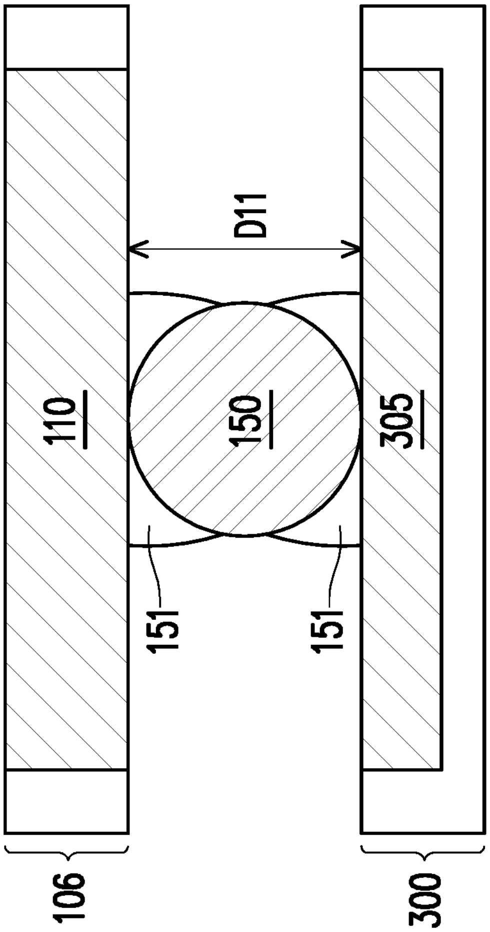
Figure 32:
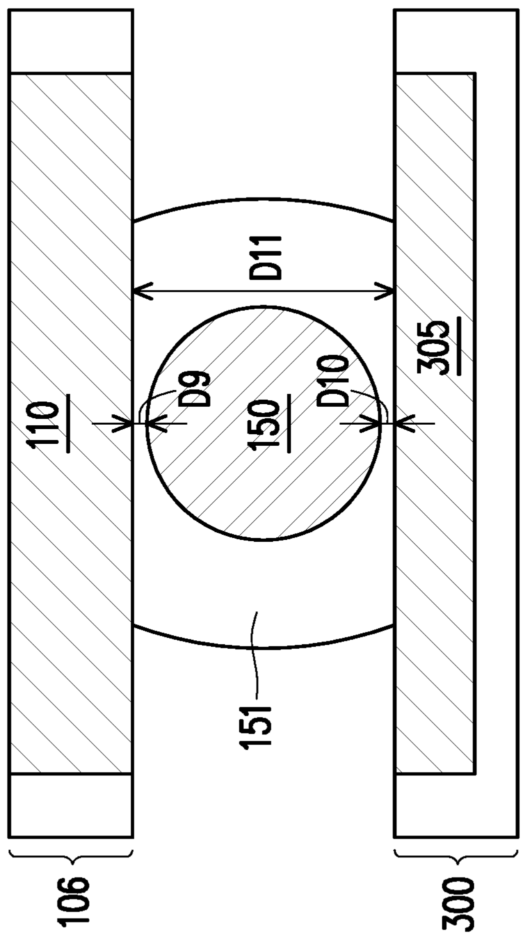

In FIGS. 30 through 32, a close up of a connection having spacer 150 is illustrated, in accordance with some embodiments (see the dashed box of FIG. 29). The spacer 150 may be any of the spacers 150A, 150B, or 150C (see FIGS. 14A, 14B, and 14C). The spacer 150 may be interposed between two solder portions 151 which physically and electrically couple the metallization pattern 110 to the contact pad 305 of the package substrate 300. As illustrated in FIG. 30, the solder portions 151 may surround a portion of the spacer 150. In some embodiments, therefore, sidewalls of the spacer 150 may be exposed free from the solder portions 151. In some embodiments, the two solder portions 151 may be joined together and completely encapsulate the spacer 150.

The spacer 150 may be equally distant from the metallization pattern 110 and the contact pad or may be vertically closer to the metallization pattern 110 or vertically closer to the contact pad 305. In some embodiments, the distance D9 between the spacer 150 and the metallization pattern 110 may be between about 0 μm and about 400 μm and the distance D10 between the spacer 150 and the contact pad 305 may be between about 0 μm and about 400 μm, though other distances are contemplated and may be used. FIG. 31 illustrates an embodiment where both the distance D9 and the distance D10 is 0 μm. The distance D11 between the metallization pattern 110 and the contact pad 305 is determined by the diameter of the spacer 150 and the distances D9 and D10. The minimum distance for D11 is about the same as the diameter of the spacer 150. In some embodiments, depending on the material of the spacer 150, the spacer 150 may be deformable so that it deforms between 0% and about 50%, such as about 5%. In such embodiments, the minimum distance for D11 is about 50% to about 100% of the diameter of the spacer 150.

In some embodiments, the solder material for the solder portions 151 may be provided on the contact pad 305 and/or the metallization pattern 110, for example, by an electroplated solder material, a printed solder paste, a solder pad, and so forth. In some embodiments the solder material for the solder portions 151 may come from the spacer 150. For example, where the spacer 150 has multiple layers, such as described above with respect to spacer 150B and 150C, an outer layer of the spacer 150 may include a solder material. In some embodiments, when the solder material of the outer layer of the spacer 150 is reflowed at the same time the conductive connectors 170 are reflowed, the solder portions 151 may be formed. In other embodiments, the solder material of the outer layer of the spacer 150 may be reflowed prior to coupling the package 100 to the package substrate 300 to couple the spacer 150 to the metallization patterns 110. In such embodiments, the solder portions 151 between the spacer 150 and the metallization patterns 110 may be formed first, followed by the solder portions 151 between the spacer 150 and the contact pads 305 when the conductive connectors 170 are reflowed.

In FIG. 32, the spacer 150 is illustrated where the solder portion 151 extends from the metallization pattern 110 to the contact pad 305 and encapsulates the spacer 150. The configuration of the solder portion 151 in FIG. 32 may be used for any of the embodiments for the spacer 150. In particular, the configuration of the solder portion 151 in FIG. 32 is used when the spacer 150 is non-conductive, so that the solder portion 151 provides conduction from the metallization pattern 110 to the contact pad 305. The distances D9, D10, and D11 may be as described above with respect to FIG. 30.

Figure 33:
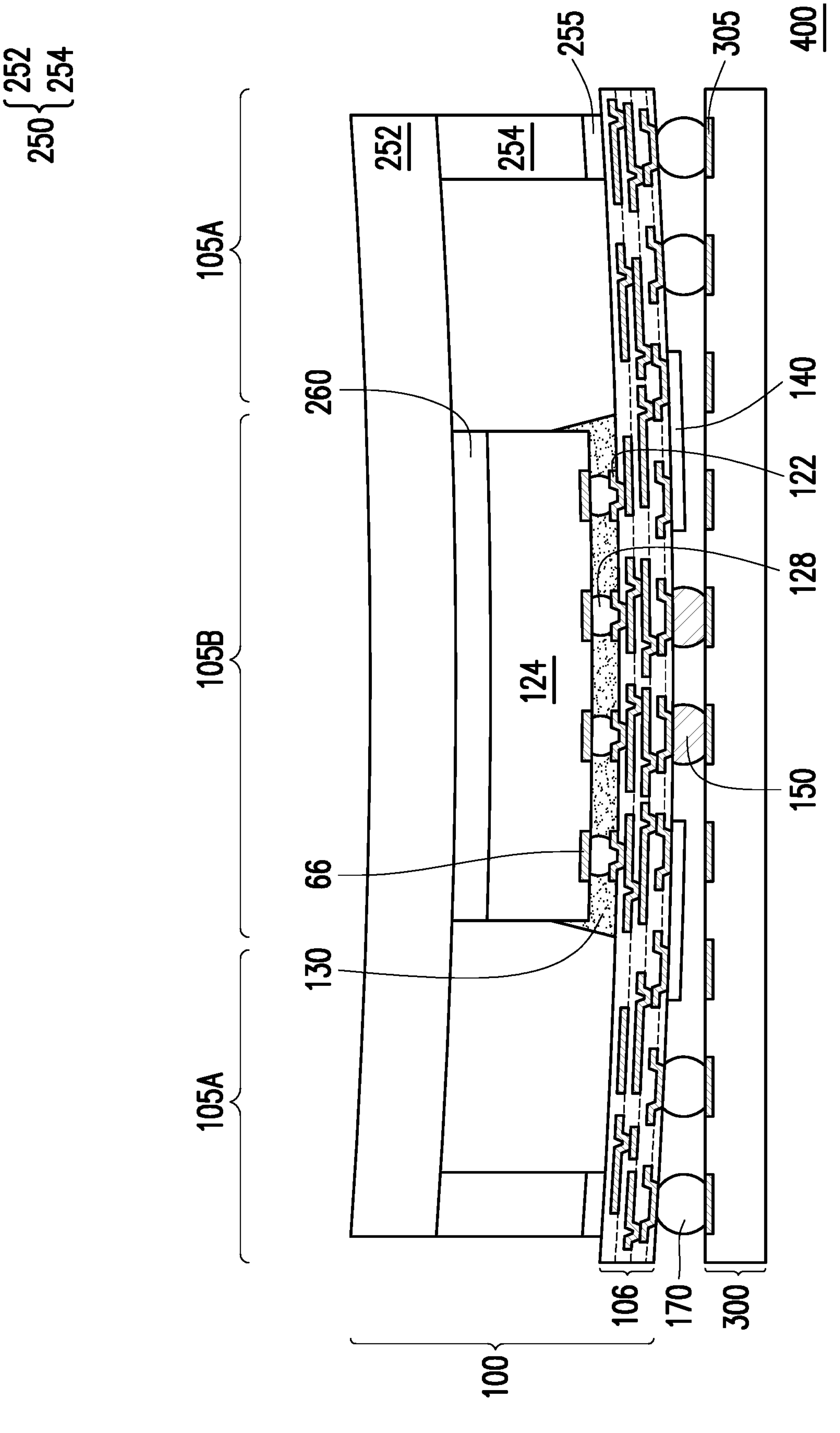

In FIG. 33, the package 100 may be mounted to a package substrate 300 using conductive connectors 170 and the connectors using spacer 150 to form 3D package 400. As illustrated in FIG. 33, the package 100 has warpage in a smile shape. When the package 100 is attached to the package substrate 300, the spacers 150 located at the middle of the edge of the package 100 (see FIG. 18A) or at the middle of the package 100 (see FIG. 18B) provides a minimum distance between the package 100 and the package substrate 300 so that the conductive connectors 170 do not expand too much toward each other to cause bridging errors.

Figure 34:
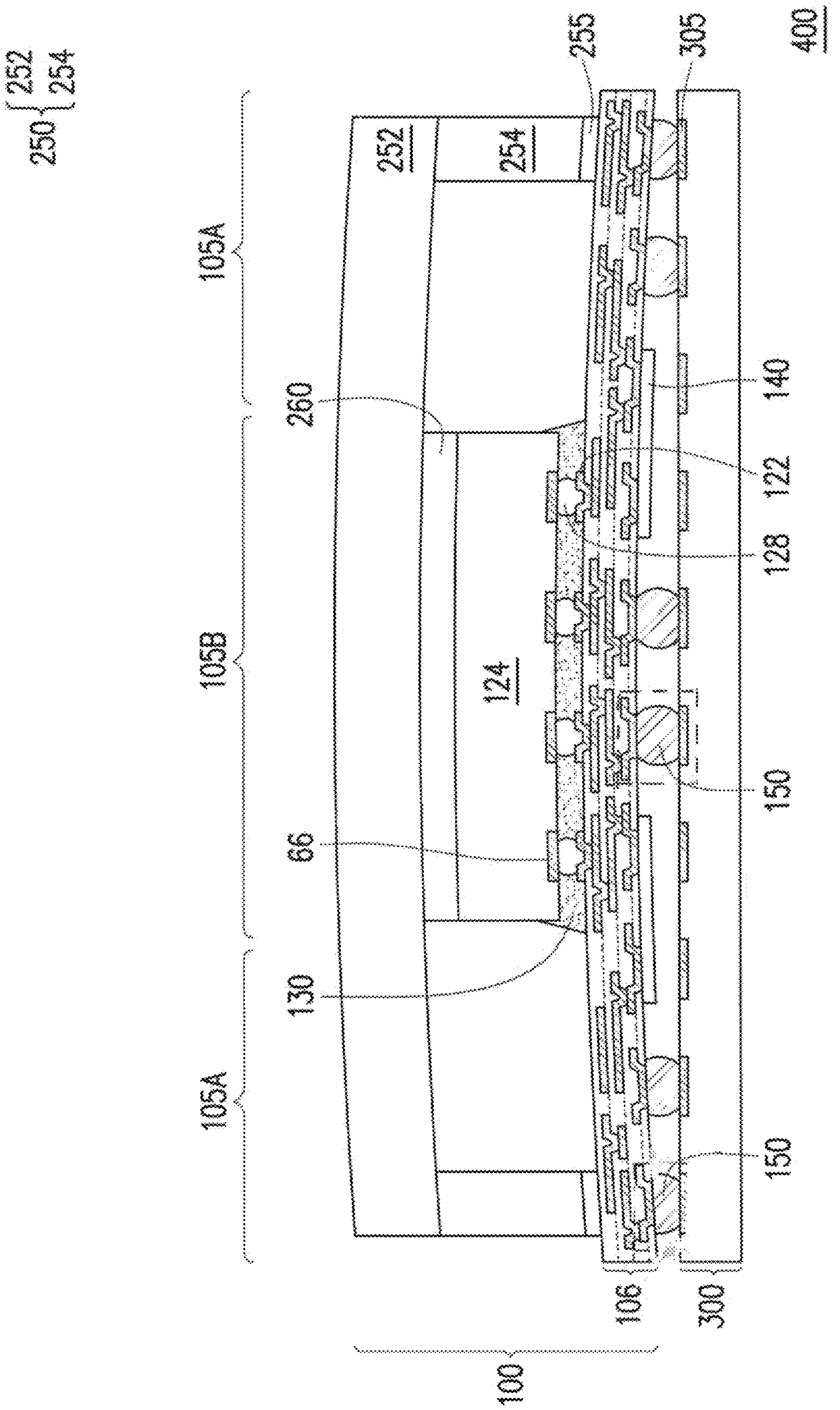

In FIG. 34, the package 100 may be mounted to a package substrate 300 using connectors with spacers 150 (and conductive connectors 170, in some embodiments) to form 3D package 400. As illustrated in FIG. 34, the package 100 has warpage in a crying or frown shape, though the package 100 could instead have a smiling shape. When the package 100 is attached to the package substrate 300, the spacers 150 located at each of the connector locations of the package 100 (see FIG. 20A) or along each edge of the package 100 (see FIG. 20B) provides a minimum distance between the package 100 and the package substrate 300. In the case of embodiments consistent with those illustrated in FIG. 20B, the minimum distance prevents the conductive connectors 170 from expanding too much toward each other which would cause bridging errors.

Figure 35:
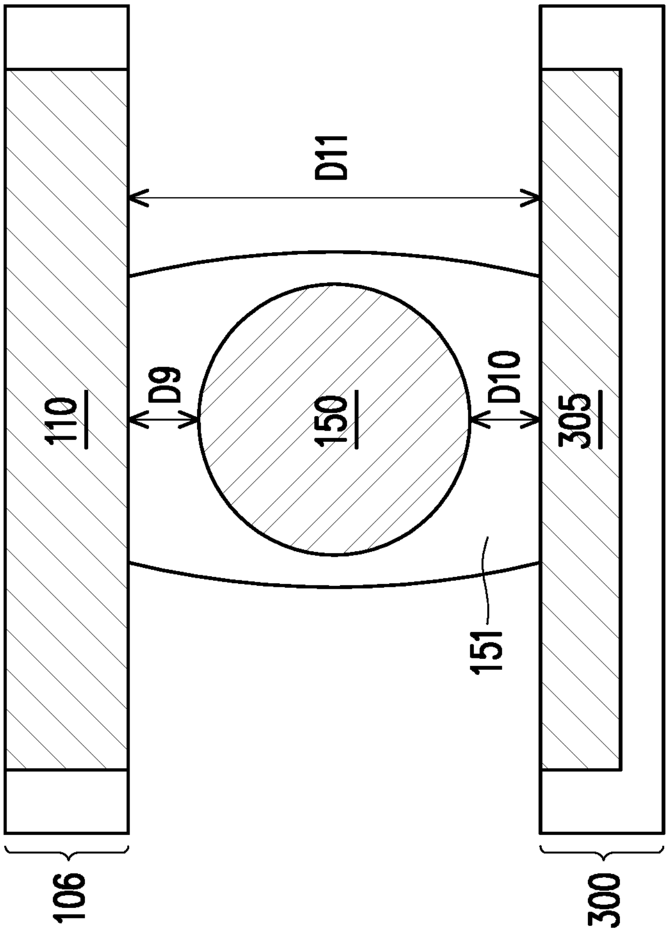

FIG. 35 illustrates a magnified view of the connector with spacer 150 which is in the dashed box of FIG. 34, in accordance with some embodiments. Where the spacer 150 is used in a connector which is in an area of the package 100 which warps away from the package substrate 300, the spacer 150 may not contact both the package 100 and package substrate 300. In other words, the distance D11 is greater than the diameter of the spacer 150. The distance D9 and distance D10 may each be in a range between about 0 μm and about 400 μm, though they may not both be 0 μm. Other dimensions are contemplated and may be used.

Figure 36:
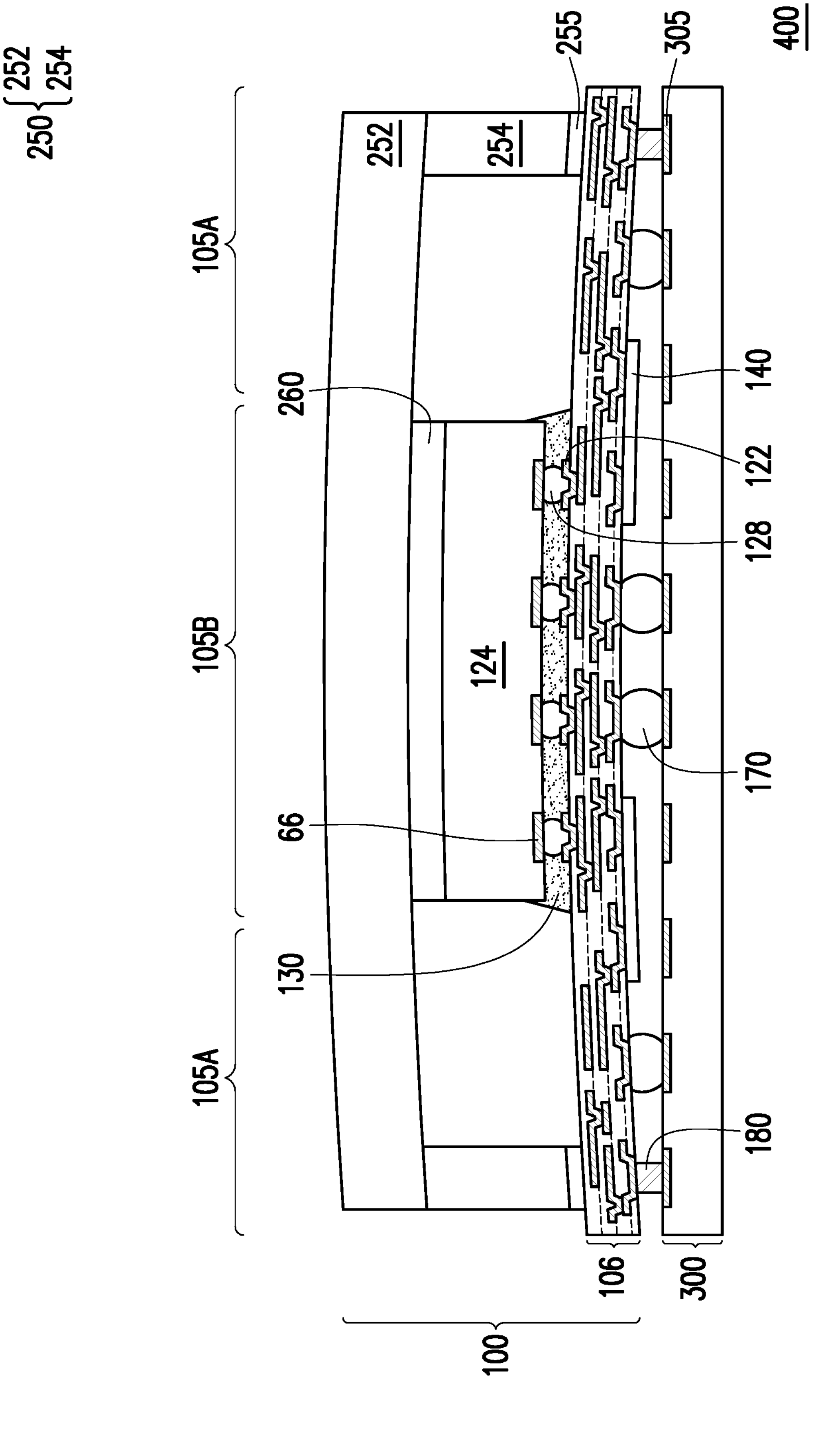

In FIG. 36, the package 100 may be mounted to a package substrate 300 using conductive connectors 170 and connectors using spacer blocks 180 to form 3D package 400. As illustrated in FIG. 36, the package 100 has warpage in a crying or frown shape. When the package 100 is attached to the package substrate 300, the spacer blocks 180 located at the corners of the package 100 provides a minimum distance between the package 100 and the package substrate 300 so that the conductive connectors 170 do not expand too much toward each other to cause bridging errors.

Figure 37:
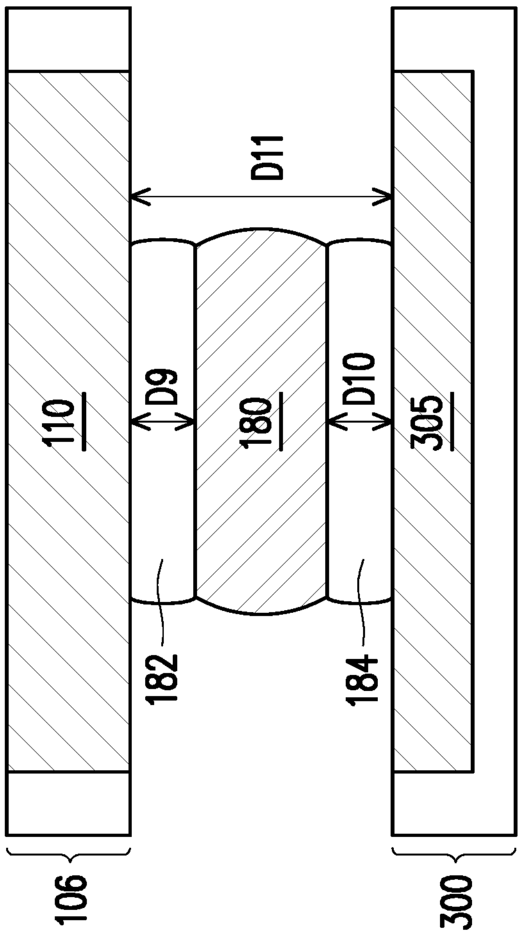
Figure 38:
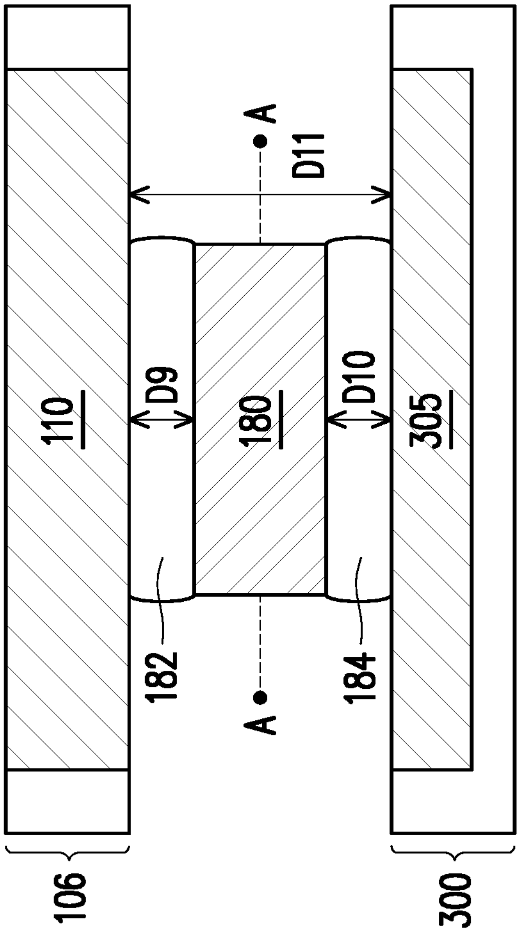

In FIGS. 37 through 38, a close up of a connection having spacer block 180 is illustrated, in accordance with some embodiments (see the dashed box of FIG. 36). Though the spacer block 180B is illustrated (see FIG. 21B), the spacer block 180 may be any of the spacer blocks 180A, 180B, or 180C (see FIGS. 21A, 21B, and 21C). In FIG. 37, the spacer block 180 may be interposed between an upper solder portion 182 and a lower solder portion 184 which physically and electrically couple the metallization pattern 110 to the contact pad 305 of the package substrate 300. In some embodiments, the material for the upper solder portion 182 may be provided on the metallization pattern 110 and the material for the lower solder portion 184 may be provided on the contact pad 305, for example, by an electroplated solder material, a printed solder paste, a solder pad, and so forth. In other embodiments, the material for the upper solder portion 182 or for the lower solder portion 184 may be provided on the spacer block 180 prior to placing the spacer blocks 180 on the metallization patterns 110 (see FIG. 22). The distances D9, D10, and D11 are similar to the distances described above with respect to FIG. 30.

In FIG. 38, the spacer block 180 is illustrated which has straight sidewalls, similar to the spacer block 180A or the spacer block 180B (see FIGS. 21A and 21C, respectively).

Figure 39B:
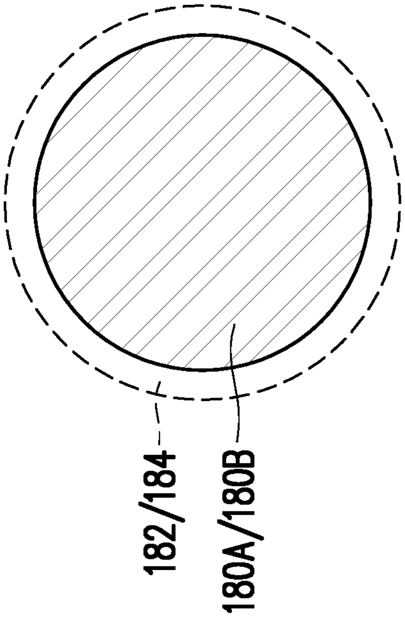
Figure 39A:
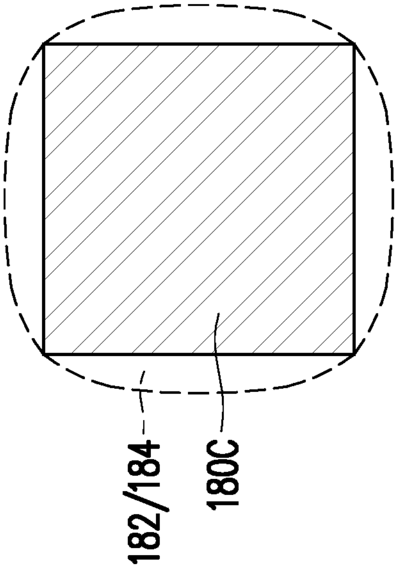

In FIGS. 39A and 39B a cross-sectional view of the spacer block 180 along the plane A-A of FIG. 38 is illustrated. In FIG. 39A, the spacer block 180 illustrated is consistent with that of spacer block 180C of FIG. 21C. In FIG. 39B, the spacer block 180 illustrated is consistent with that of spacer block 180A of FIG. 21A or spacer block 180B of FIG. 21B. In FIG. 39A, the dashed outline represents a projection of the outline of the upper solder portion 182 and/or the lower solder portion 184. As seen in FIG. 39A, the outline of the upper solder portion 182 and/or the lower solder portion 184 may have rounded sides. As seen in FIG. 39B, the outline of the upper solder portion 182 and/or the lower solder portion 184 is circular.

Figure 40:
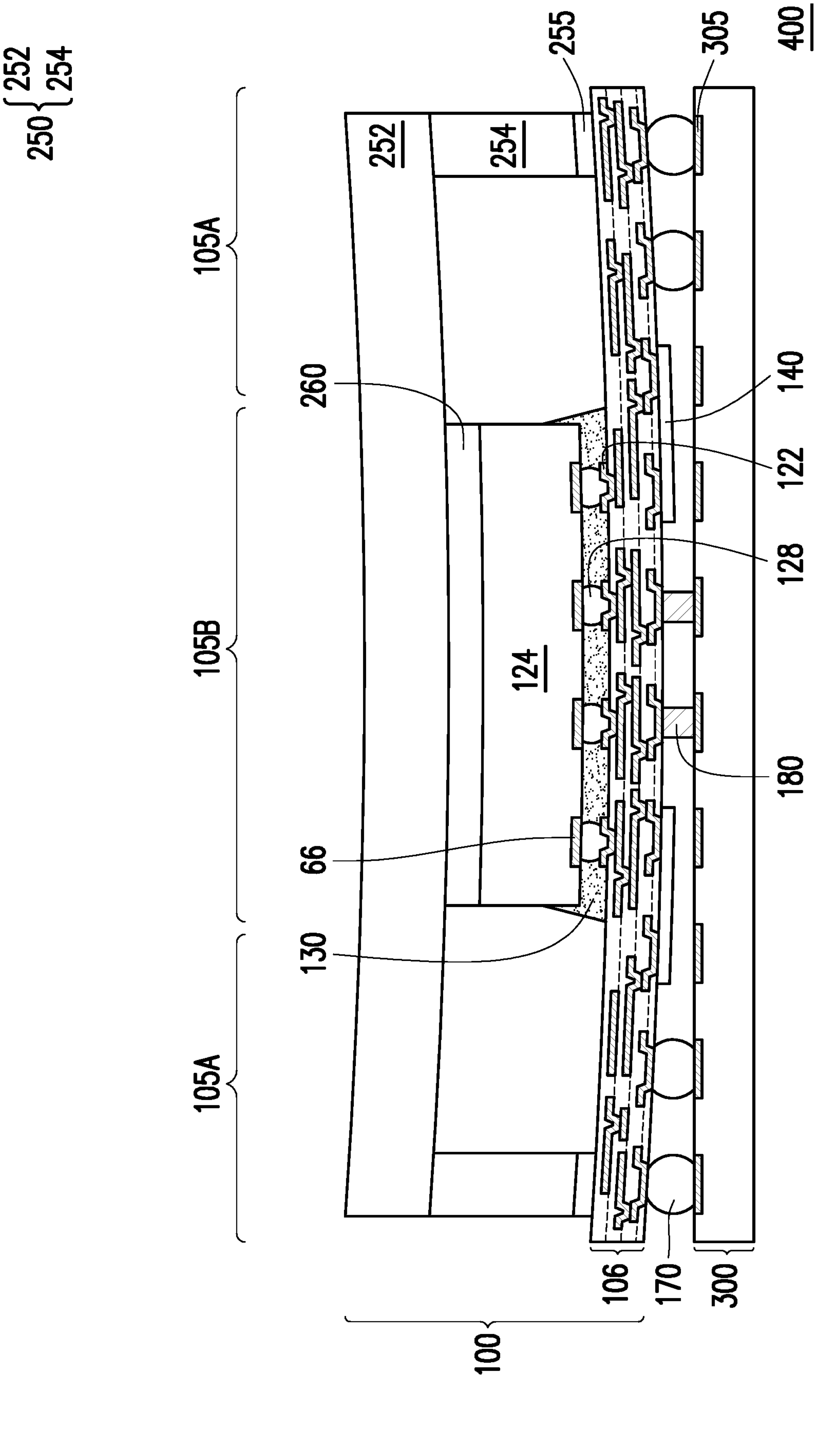

In FIG. 40, the package 100 may be mounted to a package substrate 300 using conductive connectors 170 and connectors using spacer blocks 180 to form 3D package 400. As illustrated in FIG. 40, the package 100 has warpage in a smile shape. When the package 100 is attached to the package substrate 300, the spacer blocks 180 located at the middle of the edge of the package 100 (see FIG. 26A) or at the middle of the package 100 (see FIG. 26B) provides a minimum distance between the package 100 and the package substrate 300 so that the conductive connectors 170 do not expand too much toward each other to cause bridging errors.

Figure 41:
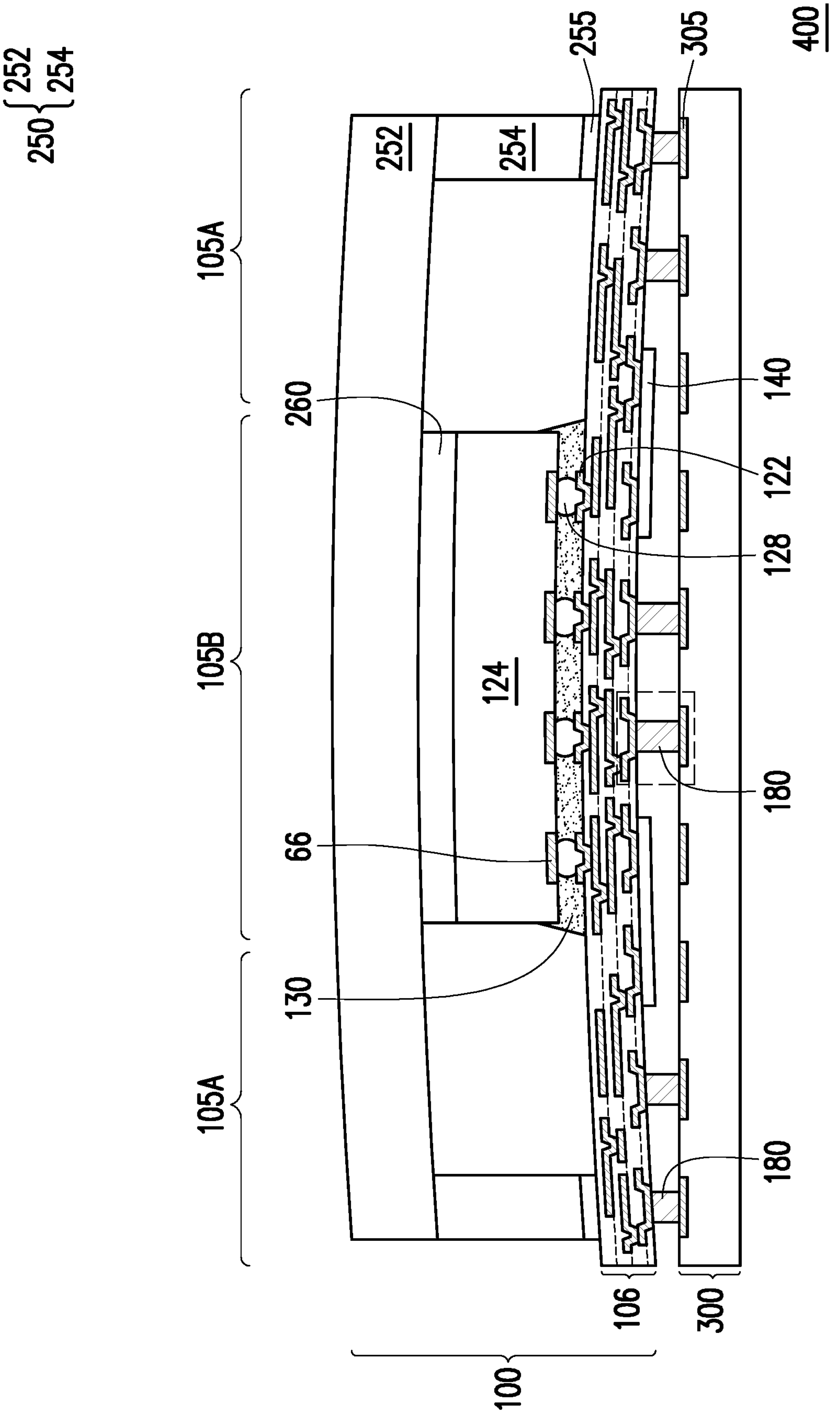

In FIG. 41, the package 100 may be mounted to a package substrate 300 using connectors with spacer blocks 180 (and conductive connectors 170, in some embodiments) to form 3D package 400. As illustrated in FIG. 41, the package 100 has warpage in a crying or frown shape, though the package 100 could instead have a smiling shape. When the package 100 is attached to the package substrate 300, the spacer blocks 180 located at each of the connector locations of the package 100 (see FIG. 28A) or along each edge of the package 100 (see FIG. 28B) provides a minimum distance between the package 100 and the package substrate 300. In the case of embodiments consistent with those illustrated in FIG. 28B, the minimum distance prevents the conductive connectors 170 from expanding too much toward each other which would cause bridging errors.

Figure 42:
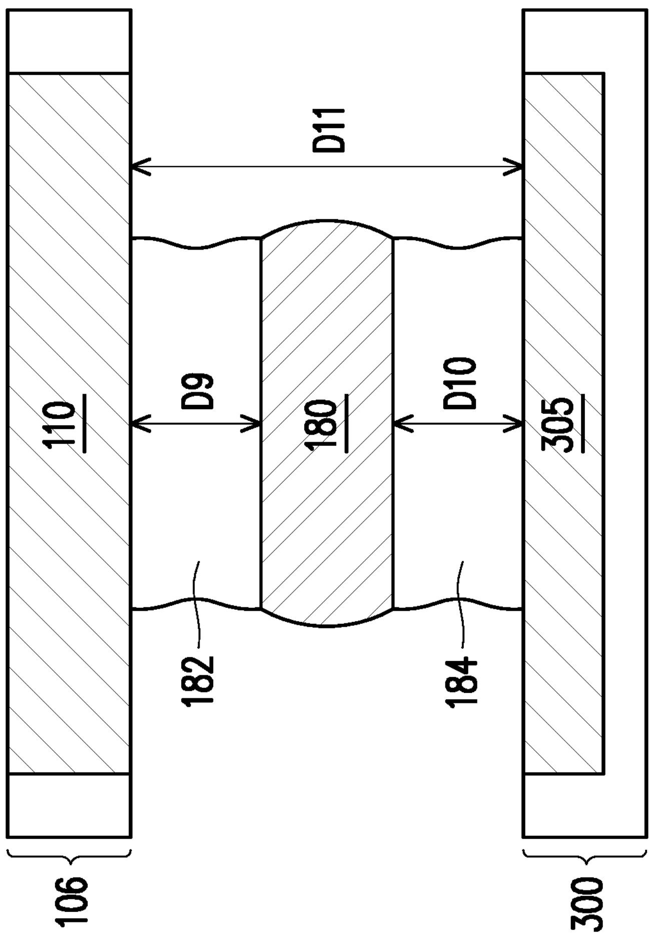

FIG. 42 illustrates a magnified view of the connector with spacer block 180 which is in the dashed box of FIG. 41, in accordance with some embodiments. Where the spacer block 180 is used in a connector which is in an area of the package 100 which warps away from the package substrate 300, the distance D9 and/or distance D10 may be greater than in a connector which is in an area of the package 100 which warps towards the package substrate 300. After the package 100 is pressed to the package substrate 300 and the upper solder portion 182 and lower solder portion 184 is reflowed, the width of the upper solder portion 182 and/or lower solder portion 184 may indent on the sides, forming an hour glass shape.

Embodiments provide a spacer ball or spacer block in certain connectors between a package and another substrate.

These spacers maintain a minimum distance between the package and the substrate so that warpage in the package does not cause connector bridging in connectors where the warpage causes the distance between the package and the substrate to be too small such that a connector is bridged with another connector by being squished and deformed too wide. These spacers can be made of several different types of material and be conductive or non-conductive. The spacer balls may be surrounded in whole or in part by solder. The spacer blocks may be attached using solder. The spacer blocks may be positioned on the package using a pick and place process. The spacer balls may be positioned on the package using a ball-grid-array formation process. As a result, the package bonding is less prone to errors and the bonding process may use warped packages which are warped more than tolerances would normally allow.

One embodiment is a device including a first package, the first package including an embedded die and a first redistribution structure. First connectors are attached to the redistribution structure, the first connectors including a spacer embedded in the first connectors. Second connectors are attached to the redistribution structure, the second connectors being free from the spacer. A material of the spacer has a first reflow temperature, the second connectors have a second reflow temperature, and the first reflow temperature is greater than the second reflow temperature. The device also includes a second package, the first connectors and the second connectors electrically and physically coupling the first package to the second package. In an embodiment, the first connectors are disposed in corners of the first package. In an embodiment, the spacer is spherical. In an embodiment, the spacer has a flat upper surface and a flat lower surface. In an embodiment, the spacer includes a core material surrounded by one or more additional layers. In an embodiment, the first connectors further include: a first solder material disposed between the spacer and a first contact of the first package, and a second solder material disposed between the spacer and a second contact of the second package, where a portion of the spacer is free from the first solder material and free from the second solder material. In an embodiment, a first distance between the first package and the second package at the first connectors is less than a second distance between the first package and the second package at the second connectors. In an embodiment, the first package is warped.

Another embodiment is a device including a first package, the first package including an embedded die interposed between a first redistribution structure and a package lid, the first redistribution structure having first contact regions and second contact regions at a front side of the redistribution structure. First connectors are disposed over first contact regions of the first package, the first connectors each including a spacer embedded in a solder material. Second connectors are disposed over second contact regions of the first package, the second connectors each including the solder material. The solder material has a lower reflow temperature than a reflow temperature of a material of the spacer. In an embodiment, the first connectors are disposed at a middle of a row of first connectors and second connectors. In an embodiment, the spacer is encapsulated within the solder material. In an embodiment, the spacer has a flat upper surface and a flat lower surface. In an embodiment, the spacer includes: a spherical plastic core, and a conductive material layer surrounding the spherical plastic core, the conductive material layer having a reflow temperature higher than the reflow temperature of the solder material. In an embodiment, an uppermost surface of the first connectors and an uppermost surface of the second connectors are not level due to warpage in the first package. In an embodiment, the first package further includes a surface mount device disposed at a surface of the first package among the first connectors and the second connectors.

Another embodiment is a method including disposing first connectors on front side of a first package, the first connectors including a spacer, and disposing second connectors on the front side of the first package, the second connectors being free from the spacer. The first package is aligned to a second device substrate. The first connectors and the second connectors are reflowed to physically and electrically couple the first package to the second device substrate, the spacer maintaining its shape during the reflowing, the spacer providing a minimum distance between the first package and the second device substrate at the first connectors during the reflowing, where the minimum distance corresponds to a height of the spacer. In an embodiment, disposing the first connectors includes using a pick and place process to position spacers on a contact of the first package and reflowing a solder material to attach the spacers to the first package. In an embodiment, disposing the second connectors includes performing a ball grid formation process to position solder balls over contacts of the first package and reflowing the solder balls to attach the solder balls to the first package, where disposing the first connectors and the second connectors occurs simultaneously. In an embodiment, the spacer is spherical. In an embodiment, a first material of the spacer includes a metal, a metal alloy, a plastic, or a ceramic, and where the first material of the spacer has a higher melting point than a second material of the second connectors. In an embodiment, the first connectors further include a first barrier layer surrounding the spacer, and a conductive layer surrounding the first barrier layer. In an embodiment, the first connectors further include a second barrier layer surrounding the conductive layer and a solder material layer surrounding the second barrier layer.

Another embodiment is a method including forming a redistribution structure on a carrier substrate. The method also includes attaching an integrated circuit die to the redistribution structure. The method also includes attaching a lid over the integrated circuit die. The method also includes flipping the carrier substrate over and removing the carrier substrate from the redistribution structure. The method also includes depositing first connectors on the redistribution structure, the first connectors including a spacer embedded a first solder, where a material of the spacer has a first melting temperature, the first solder has a second melting temperature, and the first melting temperature is greater than the second melting temperature. In an embodiment, the method further includes: attaching a surface mount device to the redistribution structure. In an embodiment, the method further includes: depositing second connectors on the redistribution structure, the second connectors being free from the spacer. In an embodiment, after depositing the first connectors and the second connectors, a height of each of the first connectors and the second connectors is the same, and the method further includes: attaching the first connectors and the second connectors to a substrate, a distance between the redistribution structure and the substrate at a first connector of the first connectors being smaller than a distance between the redistribution structure and the substrate at a second connector of the second connectors. In an embodiment, the method further includes: attaching the first connectors and the second connectors to a substrate, a spacer of one connector of the first connectors physically contacting both the substrate and the redistribution structure. In an embodiment, the method further includes: laterally encapsulating the integrated circuit die by a first encapsulant. In an embodiment, the method further includes reducing diffusion of a first material of the spacer to the first solder by a first barrier layer surrounding the spacer. The method further includes forming a conductive material layer surrounding the first barrier layer and a second barrier layer surrounding the conductive material layer.

Another embodiment is a method including placing a first set of connectors on a first package, the first package including an embedded die. The method also includes reflowing the first set of connectors to attach the first set of connectors to a connector surface of the first package, each connector of the first set of connectors including a spacer embedded therein, the spacer including a solid core material surrounded by a first barrier layer. The method also includes cooling the first package, where following the reflowing of the first set of connectors, the first package has a warped connector surface. In an embodiment, the method further includes: attaching the first set of connectors to a substrate, where every connector attached to both the first package and the substrate is a connector in the first set of connectors. In an embodiment, the method includes attaching a first connector of the first set of connectors to a first contact pad of the first package and a second contact pad of the substrate, where a first spacer of the first connector contacts both the first contact pad and the second contact pad; and attaching a second connector of the first set of connectors to a third contact pad of the first package and a fourth contact pad of the substrate, where a second spacer of the second connector contacts neither the third contact pad nor the fourth contact pad, the first spacer and the second spacer being the same size. In an embodiment, the method further includes attaching a surface mount device between two connectors of the first set of connectors. In an embodiment, each of the second set of connectors is free from the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

disposing first connectors on a front side of a first package, each first connector having embedded therein a spacer, wherein the spacer includes an inner portion comprising a core, a first barrier layer surrounding the core, and a conductive layer surrounding the first barrier layer, and wherein the spacer further includes an outer portion comprising a eutectic solder material layer surrounding the conductive layer, the eutectic solder material including an undoped central portion and a doped portion surrounding the central portion;

disposing second connectors on the front side of the first package, the second connectors being free from the spacer;

aligning the first package to a second device substrate; and reflowing the first connectors and the second connectors to physically and electrically couple the first package to the second device substrate wherein the first connectors are bonded to the first package at a reflow temperature and are bonded to the second device substrate at the same reflow temperature, the spacer maintaining its shape during the reflowing, the spacer providing a minimum distance between the first package and the second device substrate at the first connectors during the reflowing, wherein the minimum distance corresponds to a height of the spacer, wherein after the step of reflowing, portions of sidewalls of the conductive layer are free of solder material.

2. The method of claim 1, wherein disposing the first connectors comprises using a pick and place process to position each of the first connectors on a contact of the first package and reflowing a solder material to attach each of the first connectors to the first package.

3. The method of claim 1, wherein disposing the second connectors comprises performing a ball grid formation process to position solder balls over contacts of the first package and reflowing the solder balls to attach the solder balls to the first package, wherein disposing the first connectors and the second connectors occurs simultaneously.

4. The method of claim 1, wherein the spacer is spherical.

5. The method of claim 1, wherein a first material of the spacer comprises a metal, a metal alloy, a plastic, or a ceramic, and wherein the first material of the spacer has a higher melting point than a second material of the second connectors.

6. The method of claim 1, wherein the first connectors further comprise a first barrier layer surrounding the spacer, and a conductive layer surrounding the first barrier layer.

7. The method of claim 6, wherein the first connectors further comprise a second barrier layer surrounding the conductive layer and a solder material layer surrounding the second barrier layer.

8. A method comprising:

forming a redistribution structure on a carrier substrate;

attaching an integrated circuit die to the redistribution structure;

attaching a lid over the integrated circuit die;

flipping the carrier substrate over and removing the carrier substrate from the redistribution structure; and depositing first connectors on the redistribution structure, the first connectors comprising a spacer, a first barrier layer surrounding the spacer, a conductive layer surrounding the first barrier layer, and a eutectic solder material layer surrounding the conductive layer, the eutectic solder material layer including an undoped central region and a doped sublayer surrounding the undoped central region, wherein a material of the spacer has a first melting temperature, the eutectic solder material has a second melting temperature, and the first melting temperature is greater than the second melting temperature;

reflowing the first connectors at a reflow temperature to form a solder bond between the redistribution structure and the first connectors; and reflowing the first connectors at the same reflow temperature to form a solder bond between the first connectors and a substrate.

9. The method of claim 8, further comprising:

attaching a surface mount device to the redistribution structure.

10. The method of claim 8, further comprising:

depositing second connectors on the redistribution structure, the second connectors being free from the spacer.

11. The method of claim 10, wherein after depositing the first connectors and the second connectors, a height of each of the first connectors and the second connectors is the same, further comprising:

attaching the first connectors and the second connectors to a substrate, a distance between the redistribution structure and the substrate at a first connector of the first connectors being smaller than a distance between the redistribution structure and the substrate at a second connector of the second connectors.

12. The method of claim 10, further comprising:

attaching the first connectors and the second connectors to a substrate, a spacer of one connector of the first connectors physically contacting both the substrate and the redistribution structure.

13. The method of claim 8, further comprising:

laterally encapsulating the integrated circuit die by a first encapsulant.

14. The method of claim 8, further comprising:

reducing diffusion of a first material of the spacer to the eutectic solder material by a first barrier layer surrounding the spacer.

15. The method of claim 14, further comprising:

forming a conductive material layer surrounding the first barrier layer and a second barrier layer surrounding the conductive material layer.

16. A method comprising:

placing a first set of connectors on a first package, the first package comprising an embedded die;

reflowing the first set of connectors at a reflow temperature to attach the first set of connectors to a connector surface of the first package, each connector of the first set of connectors including a spacer embedded therein, each spacer comprising a solid core, a first barrier layer surrounding the solid core, a conductive layer surrounding the first barrier layer, a second barrier layer surrounding the conductive layer, and a eutectic solder material layer surrounding the second barrier layer, the eutectic solder material layer including an undoped central region and a doped sublayer at its outer periphery; and reflowing the first set of connectors at a reflow temperature to attach the first set of connectors to a connector surface of a substrate; and cooling the first package, wherein after the first set of connectors are attached to the substrate, the first package has a warped connector surface.

17. The method of claim 16, further comprising:

attaching the first set of connectors to a substrate, wherein every connector attached to both the first package and the substrate is a connector in the first set of connectors.

18. The method of claim 16, further comprising:

attaching a first connector of the first set of connectors to a first contact pad of the first package and a second contact pad of a substrate, wherein a first spacer of the first connector contacts both the first contact pad and the second contact pad; and attaching a second connector of the first set of connectors to a third contact pad of the first package and a fourth contact pad of the substrate, wherein a second spacer of the second connector contacts neither the third contact pad nor the fourth contact pad, the first spacer and the second spacer being the same size.

19. The method of claim 16, further comprising:

attaching a surface mount device between two connectors of the first set of connectors.

20. The method of claim 16, further comprising:

placing a second set of connectors on the first package and reflowing the second set of connectors to attach the second set of connectors to the connector surface of the first package, wherein each of the second set of connectors is free from the spacer.

* * * * *